United States Patent [19]
Reymond et al.

[11] Patent Number: 5,215,471
[45] Date of Patent: Jun. 1, 1993

[54] ELECTRICAL CONNECTORS HAVING TAPERED SPRING CONTACT ELEMENTS FOR DIRECT MATING TO HOLES

[75] Inventors: Welles K. Reymond, Waterbury, Conn.; Gregory L. Sorrentino, Brewster, N.Y.

[73] Assignee: General DataComm, Inc., Middlebury, Conn.

[21] Appl. No.: 898,346

[22] Filed: May 27, 1992

Related U.S. Application Data

[63] Continuation of Ser. No. 605,523, Oct. 29, 1990, abandoned, which is a continuation-in-part of Ser. No. 366,546, Jun. 13, 1989, Pat. No. 4,966,556.

[51] Int. Cl.⁵ .............................................. H01R 9/09
[52] U.S. Cl. ....................................... 439/66; 439/65; 439/67; 439/341
[58] Field of Search ................ 439/55, 65, 66, 67, 439/74, 75, 77, 78, 79, 80, 81, 38, 39, 364, 381, 493, 700, 131, 341; 324/158 F, 158 P; 29/876, 882, 884

[56] References Cited

U.S. PATENT DOCUMENTS

| | | | |
|---|---|---|---|
| 3,144,527 | 8/1964 | Tolegian | 200/51.09 |
| 3,215,968 | 11/1965 | Herrmann | 339/17 |
| 3,290,636 | 12/1966 | Overtveld | 439/66 |
| 3,404,362 | 10/1968 | Amendola | 339/17 |
| 3,407,378 | 10/1968 | Siders | 339/176 |
| 3,430,182 | 2/1969 | Blanche | 339/17 |
| 3,447,249 | 6/1969 | Greger | 35/19 |
| 3,504,328 | 3/1970 | Olsson | 339/17 |
| 3,550,062 | 12/1970 | Drenten | 339/17 |
| 3,601,762 | 8/1971 | Eshelman | 339/64 M |
| 3,783,433 | 1/1974 | Kurtz | 339/17 C |
| 3,810,258 | 5/1974 | Mathauser | 339/12 R |
| 3,885,215 | 5/1975 | Weinstock | 324/158 P |
| 3,899,231 | 8/1975 | Bray | 361/408 |
| 3,996,516 | 12/1976 | Luther | 324/158 F |
| 4,004,298 | 1/1977 | Freed | 3/1 |
| 4,009,921 | 1/1977 | Narozny | 439/400 |
| 4,012,093 | 3/1977 | Crane | 339/17 F |
| 4,042,880 | 8/1977 | Weinstock | 324/64 |
| 4,050,769 | 9/1977 | Ammon | 339/196 M |
| 4,095,867 | 6/1978 | Parks | 439/329 |
| 4,118,090 | 10/1978 | Del Mei | 339/12 R |
| 4,164,704 | 8/1979 | Kato | 324/73 PC |
| 4,175,810 | 11/1979 | Holt | 339/17 C |

(List continued on next page.)

FOREIGN PATENT DOCUMENTS

| | | |
|---|---|---|
| 2845632 | 5/1979 | Fed. Rep. of Germany . |
| 3441480A1 | 5/1986 | Fed. Rep. of Germany . |
| 3500227A1 | 7/1986 | Fed. Rep. of Germany . |

OTHER PUBLICATIONS

IBM Bulletin, Faure, vol. 17, No. 2, p. 444, Jul. 1974.
IBM Bulletin, Schick, vol. 6, No. 10, p. 5, Mar. 1964.
Research Disclosure, Kenneth Mason Publications Ltd. No. 280, p. 28018, Aug. 1987.

*Primary Examiner*—Neil Abrams
*Attorney, Agent, or Firm*—David P. Gordon

[57] ABSTRACT

Electrical connectors are provided with spring contact elements each having a tapered contact portion for mating with the plated rim of a hole. The tapered contact portion can be configured as a bifurcated cone, a suitably shaped wire, or other tapered, flexible contact. Besides the contact portion, the contact elements also include spring portions which can assume various configurations and tail portions which can also assume various configurations. Where the tapered contact portion is a suitably shaped wire, the spring portion and the contact portion are essentially the same. The tail portions can be arranged to have tapered contact portions where permanent connection of the tail is not desired. The disclosed electrical connectors have housings for the spring contact elements, and a first make, last break function can be provided by configuring the housings appropriately. The holes with which the tapered spring contact elements mate can be part of a printed circuit board, a flex circuit, or other object.

29 Claims, 18 Drawing Sheets

U.S. PATENT DOCUMENTS

| | | | |
|---|---|---|---|
| 4,242,657 | 12/1980 | Chaillot | 335/207 |
| 4,245,189 | 1/1981 | Wahl | 324/65 P |
| 4,270,826 | 6/1981 | Narozny | 339/75 MP |
| 4,321,532 | 3/1982 | Luna | 324/73 PC |
| 4,381,134 | 4/1983 | Anselmo | 339/220 R |
| 4,428,640 | 1/1984 | Pittman | 339/176 M |
| 4,443,756 | 4/1984 | Lightbody | 324/73 PC |
| 4,448,466 | 5/1984 | Porter | 339/17 M |
| 4,479,685 | 10/1984 | Kirby | 339/12 R |
| 4,498,722 | 2/1985 | Fedder | 339/75 MP |
| 4,504,101 | 3/1985 | Reimer | 339/17 L |
| 4,510,553 | 4/1985 | Faultersack | 361/413 |
| 4,526,429 | 7/1985 | Kirkman | 339/17 C |
| 4,528,500 | 7/1985 | Lightbody | 324/73 PC |
| 4,533,203 | 8/1985 | Feldman | 339/176 M |
| 4,541,678 | 9/1985 | Lumpp | 339/75 MP |
| 4,548,452 | 10/1985 | Gillett | 339/17 R |
| 4,550,962 | 11/1985 | Czeschka | 339/17 LC |
| 4,571,542 | 2/1986 | Arai | 324/158 P |
| 4,587,596 | 5/1986 | Bunnell | 361/398 |
| 4,606,589 | 8/1986 | Elsbree, Jr. | 339/17 C |
| 4,652,066 | 3/1987 | Pelzl | 339/17 LC |
| 4,675,600 | 6/1987 | Gergin | 324/158 P |
| 4,691,979 | 9/1987 | Manska | 339/17 C |
| 4,701,703 | 10/1987 | Malloy | 324/158 P |
| 4,707,655 | 11/1987 | Kruger | 324/158 P |
| 4,717,344 | 1/1988 | Schempp | 439/61 |
| 4,721,908 | 1/1988 | Driller | 324/158 F |
| 4,724,383 | 2/1988 | Hart | 324/158 F |
| 4,730,086 | 3/1988 | Kamijo | 174/74 R |
| 4,735,587 | 4/1988 | Kirayogin | 439/751 |
| 4,744,764 | 5/1988 | Rubenstein | 439/62 |
| 4,755,149 | 7/1988 | de Jong | 439/248 |
| 4,758,186 | 7/1988 | Guglhor | 439/741 |
| 4,789,352 | 12/1988 | Kreinberg | 439/260 |
| 4,793,816 | 12/1988 | Pittman | 439/79 |
| 4,793,817 | 12/1988 | Hiesbock | 439/82 |
| 4,795,362 | 1/1989 | Vonder | 439/377 |
| 4,795,977 | 1/1989 | Frost | 324/158 F |
| 4,806,104 | 2/1989 | Cabourne | 439/591 |

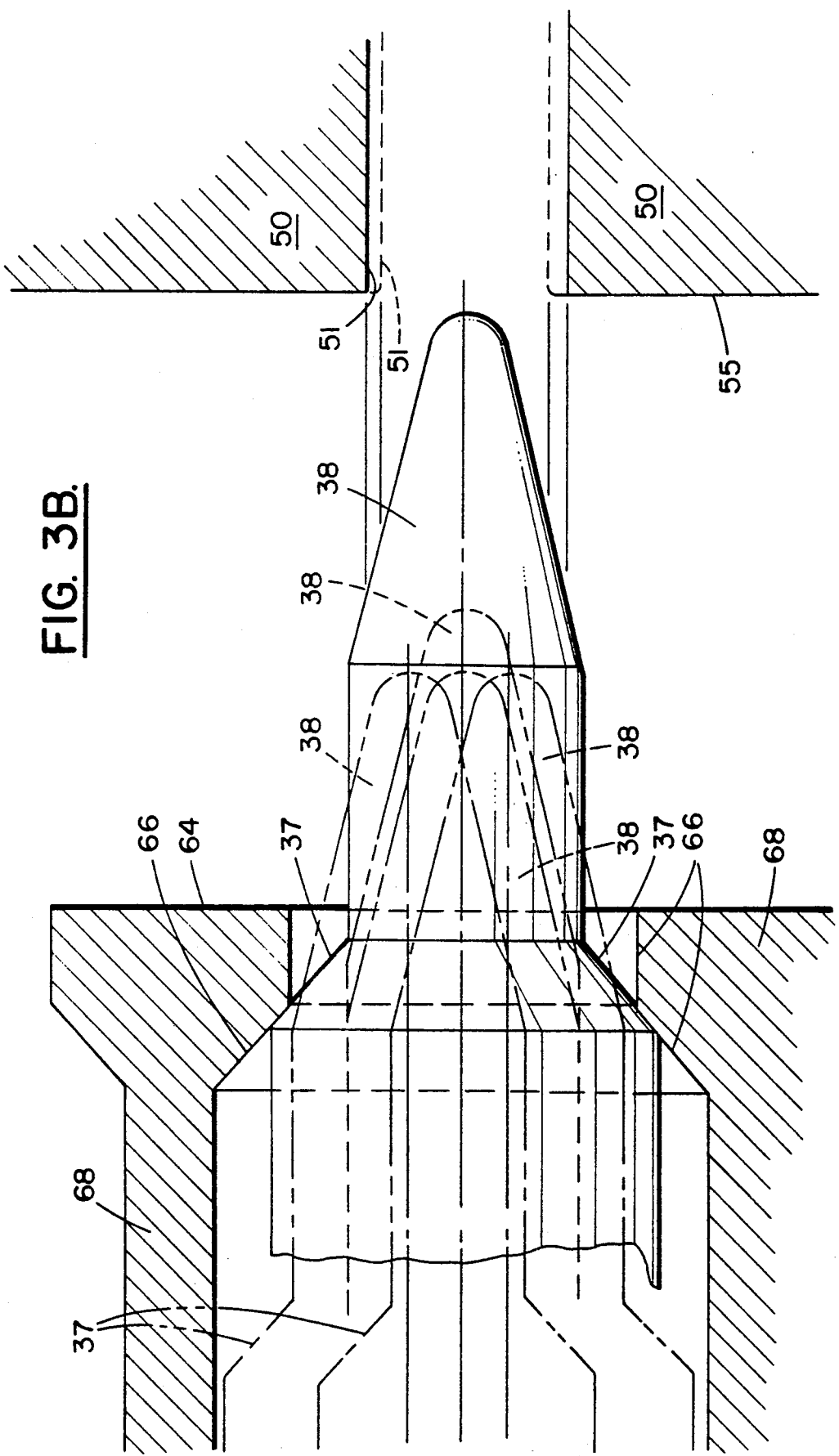

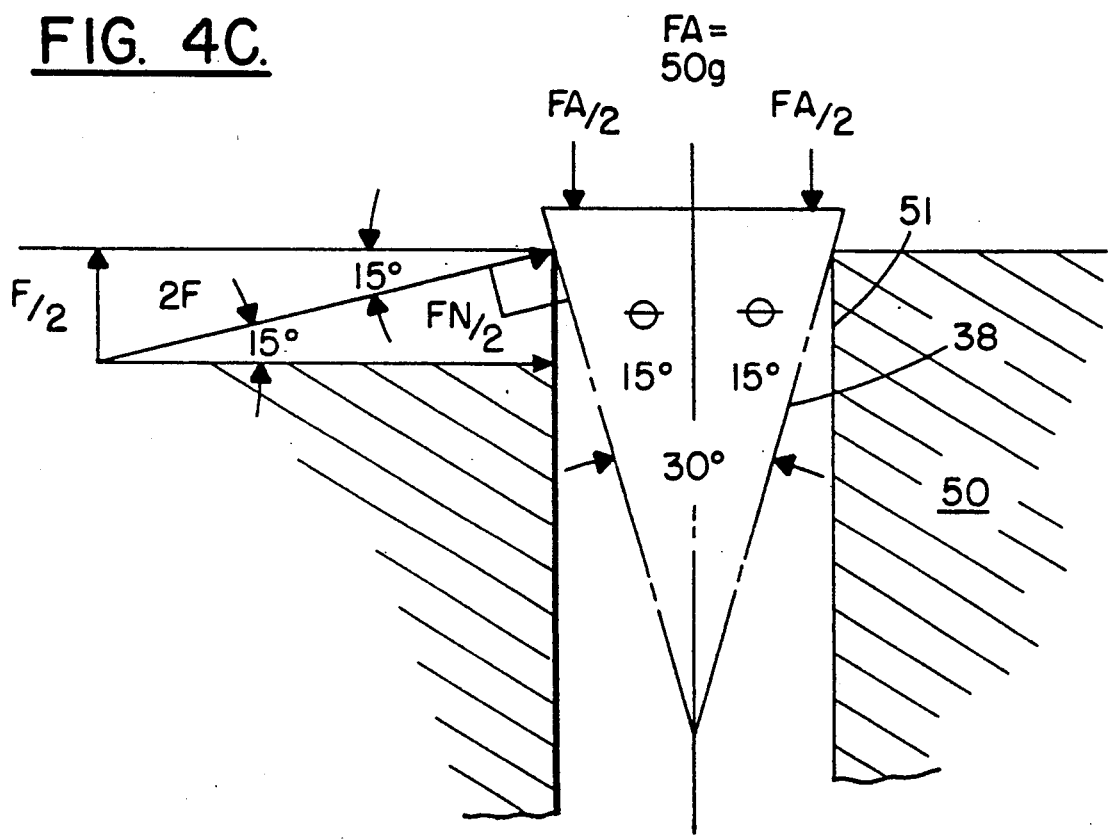

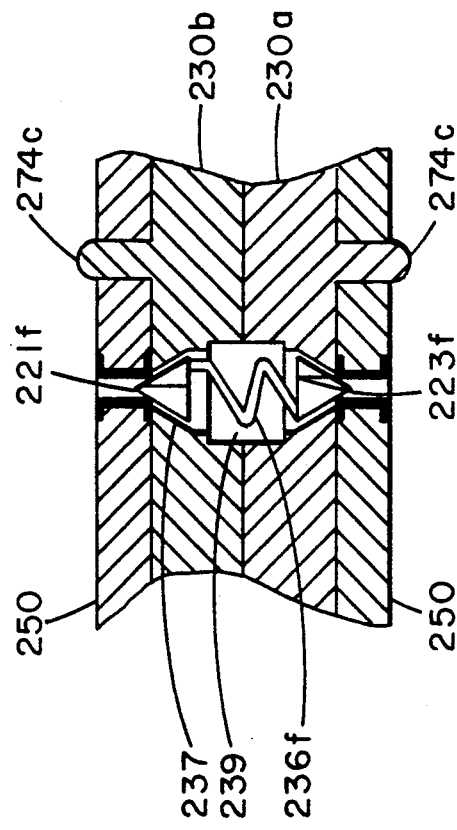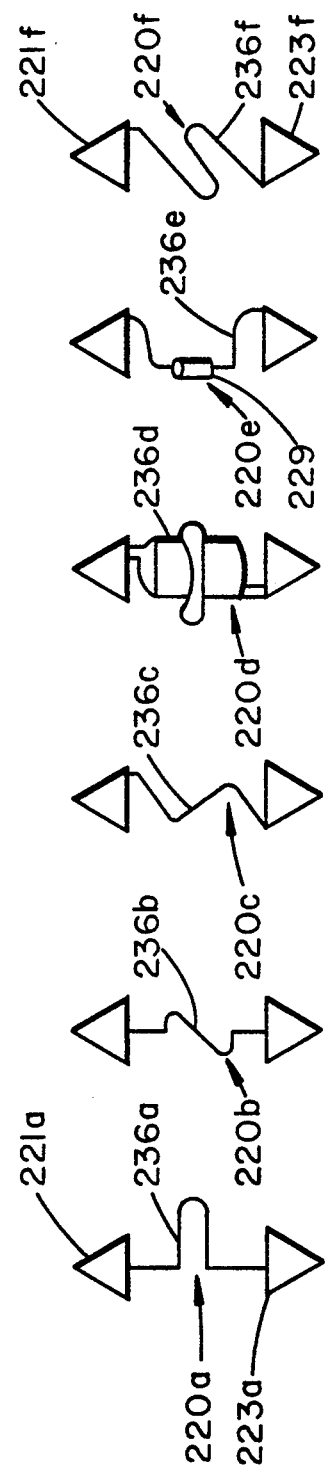

ELECTRICAL CONNECTORS HAVING TAPERED SPRING CONTACT ELEMENTS FOR DIRECT MATING TO HOLES

This is a continuation of Ser. No. 07/605,523, filed Oct. 29, 1990 now abandoned, which is a continuation-in-part of Ser. No. 07/366,546, filed Jun. 13, 1989, now issued as U.S. Pat. No. 4,966,556 which is hereby incorporated by reference in its entirety. This application is also related to U.S. Ser. No. 07/605,522 now abandoned, which is incorporated by reference in its entirety.

BACKGROUND

1. Field of the Invention

This invention relates generally to electrical connectors. More particularly, the invention relates to an electrical connector which utilizes the mating of a tapered contact element with the conductive rim of a hole for providing an electrical connector function. The invention further relates to electrically connecting a first board, cable, wire, or other current carrying means which is coupled to the contact element, to a second board, cable, wire or other current carrying means on which the conductive rim of the hole is located.

2. Prior Art

The electrical connector arts are crowded arts with many categories and subcategories of connectors. Besides the connectors of the art discussed in the Prior Art section of the parent application hereto, other types of connectors are known such as ribbon cable connectors, flex circuit connectors, pin and socket connectors, rack and panel connectors, zero insertion force connectors, coaxial cable connectors, insulation displacement connectors, quick connect/disconnect connectors, card edge connectors, board to board connectors, board to wire connectors, surface mount connectors, etc. Common to many of the connectors is that they include a male component which is coupled to a first device which is to be connected and a female component which is coupled to a second device which is to be connected, wherein the male and female components are arranged to mate. While two piece (i.e. male and female component) connectors are generally effective for their purposes, they are costly because they require two separate parts for accomplishing a single connection. In addition, where the connectors have multiple pins, connection and disconnection becomes difficult because of the forces involved, and the male connector is easily damaged during removal or reinsertion. Also, because a connector piece is required on each of the devices to be connected, the two piece connectors often take up valuable "real estate".

SUMMARY OF THE INVENTION

It is therefore an object of the invention to provide a single piece electrical connector having tapered contacts which mate with the conductive rims of holes of the device to which it is being mated.

It is a further object of the invention to provide single piece connectors for use in connecting a printed circuit board to a parallel circuit board, a perpendicular circuit board, a ribbon cable, a flat cable, a flex circuit, etc.

It is another object of the invention to provide a single piece electrical connector which accommodates large tolerances.

In accord with the objects of the invention, an electrical connector for connecting a first object to a second object having holes with conductive rims is provided and generally comprises: a plurality of contact elements, each having a first portion for making electrical contact with the first object and a second tapered contact portion for mating with a conductive rim of the hole of the second object; and fastening means for holding the tapered contact elements in mating relationship with the conductive rims. Preferably, the tapered contact elements are spring loaded in a housing to which at least one portion of the fastening means is attached.

Each aspect of the invention may take many forms. The spring portion of the contact elements may have, e.g., a u, s, or z shape. The tapered contact portion of the contact elements can take the form of a bifurcated cone or a compliant bent wire. Also, the portion of the contact elements which make electrical contact with the first object may take the form of, e.g., a post for coupling to holes, prongs for stripping insulation, a spring for surface contact, or any of many tapered forms such as described with reference to the tapered contact portion for coupling to conductive rims. The housing for the tapered contact elements may be arranged to serve various purposes. For example, by making the wall section of the housing through which the contact elements extend non-uniform, a "first make, last break" function can be accomplished. A "first make, last break" function may also be accomplished by a hinged housing. Also, the housing for the contact elements may be one piece or two piece, rear loaded or front loaded.

Other objects and advantages of the present invention will become evident upon reference to the detailed description in conjunction with the provided figures.

BRIEF DESCRIPTION OF THE DRAWINGS

FIG. 3b is an enlarged cross sectional view of the self-centering tapered funnel of the housing shown in FIG. 3a with a contact element located therein in an unengaged extended position, and in engaged depressed positions.

FIG. 3c is a partially cut-away top view of the connector of FIG. 3a taken along line C—C of FIG. 3a.

FIG. 4b is a cross sectional view of the tapered end of a single split-cone contact element of the first embodiment of the connector through line B—B of FIG. 4a.

FIG. 4c is a force diagram for a typical contact element of the connector of the invention, showing both axial insertion (hold-in) and mating contact normal forces.

FIGS. 5a-5f are diagrammatic representations of six different embodiments of the spring portion of the contact element of the invention;

FIG. 5h is a partial cross-section view of the assembled connector of FIG. 5g;

FIG. 6a is a cross section through a connector according to the invention utilizing the contact element of FIG. 6a;

DETAILED DESCRIPTION OF THE PREFERRED EMBODIMENT

Figure 1:
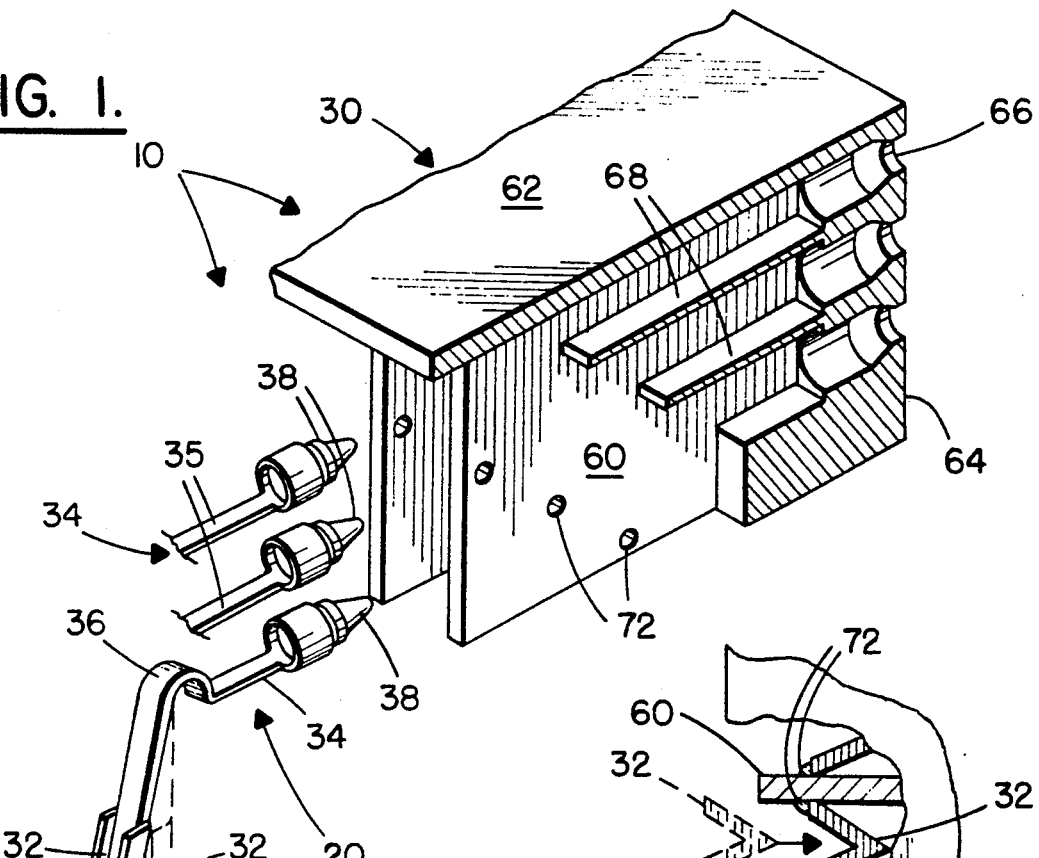
FIG. 1 is a perspective view of a column section of a first embodiment of the connector invention prior to insertion of a preformed spring contact elements into the housing.

Before describing the preferred embodiments of the invention, it should be appreciated that the connector invention as described herein is for mating with the conductive rims of the holes of an object. The holes need not be round, as connection to rims of other shaped holes (even if the rim is not continuous) is envisioned. Neither must the holes be through holes or plated through holes, as connections with blind holes or holes having only a plated rim are envisioned. Further, the object in which the holes are located need not be a printed circuit board, as connection to other objects (e.g., flex circuits) is envisioned.

FIGS. 1, 2a, 2b, 3a–3c, and 4a–4c show a first connector embodiment of the invention which is a right angle connector. The connector assembly 10 typically comprises a plurality of contact elements 20, and a dielectric housing 30 for housing the contact elements. The contact elements 30 are spring pins with first ends 32, second ends 34, and a middle bend section 36. The first ends 32 of pins 20 extend through holes 39 in a daughter board 40 and are preferably soldered to the back side 41 of the daughter board. At least a portion of the first ends 32 is preferably v-shaped to help align the first ends in the holes 39 of the daughter board 40. The shape of first ends 32 also provides stiffness, and helps in preloading the contacts as will be discussed hereinafter.

The second ends 34 of the contact elements 30 are basically comprised of a neck portion 35 which may be channel shaped for stiffness, and a tapered contact portion 38. As seen in FIG. 3b, connecting the neck portion 35 to the contact portion 38 is an angled portion 37 which acts in conjunction with the housing to provide self-alignment and preloading as will be described hereinafter.

The mid-sections 36 of pins 20 are preferably crimped to cause pins 20 to form a spring. As shown in FIG. 1, pins 20 are preferably crimped to first form a one hundred eighty degree bend and then a minus ninety degree bend, and are thus essentially bent through ninety degrees. If desired, a simple bend of ninety degrees could be used, provided mid-sections 36 form spring elements. As seen in FIG. 3a in phantom, when contact portions 38 of second ends 34 of pins 30 engage the mother board 50, the mid-sections 36 resiliently deflect away from the mother board 50; i.e. the mid-sections 36 are compliant along the mating axis. In so doing, the mid-sections 36 provide pins 30 with a mating force.

Figure 4A:
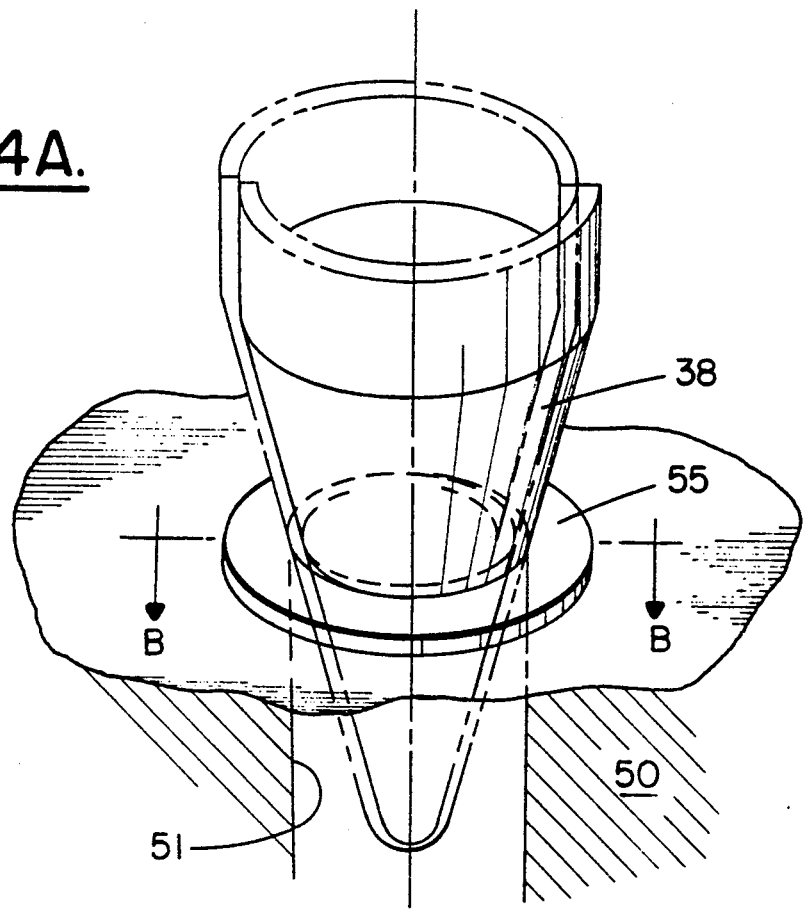
FIG. 4a is a perspective enlarged view of the tapered end of a single split-cone contact element in contact with a plated through hole.
Figure 4B:
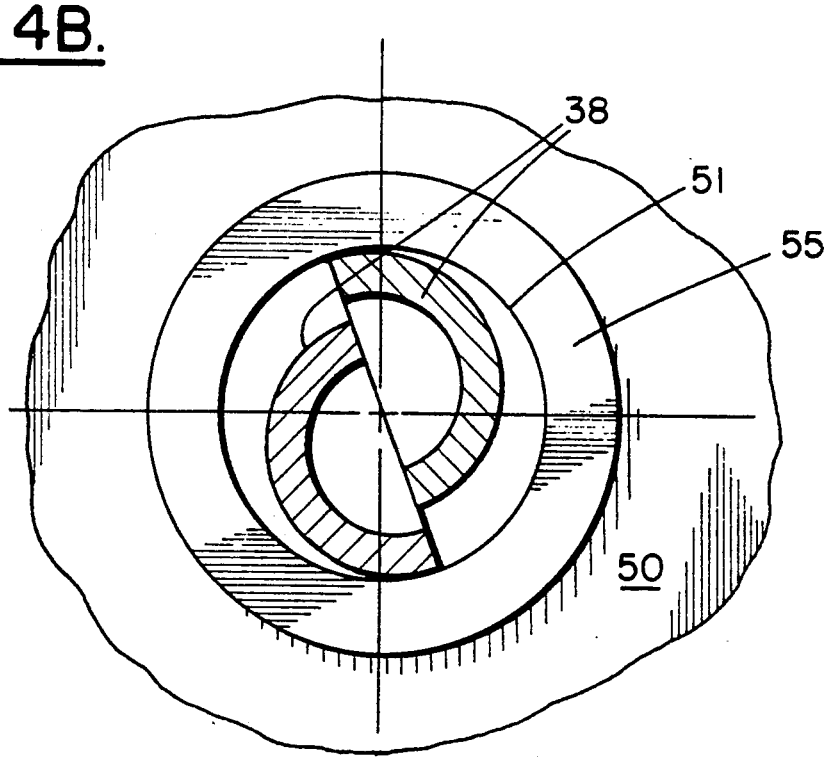

As seen in FIG. 4a, the contact portions 38 of the second ends 34 of contact elements 20 are tapered in cross section, with the cross section becoming larger further away from the end or tip of the contact element. The contact portions 38 are used to make contact with the plated through holes 51 of the mother board 50. Where the contact portions 38 of the second ends 34 are the preferred split (bifurcated) cones (as seen in FIGS. 4a and 4b), contact is made between the connector 10 and the mother board 50 at two points 53a, 53b (radius contact "points") for each contact element 20 and through hole 51. The contact is made between the tapered portion (i.e. the contact portion 38) of the contact element 20 and the rim of hole 51; i.e. the circumference of the hole 51 at the surface 55 of the mother board 50. In making contact, because contact portion 38 is bifurcated, it resiliently compresses as it is pushed into hole 51, and therefore extends into hole 51 further than it might have otherwise. As a result, the surface of contact portion 38 wipes along the rim of hole 51 as it makes contact providing desired "wipe" and enhanced contact.

As seen in idealized force diagram of FIG. 4c, the use of contact elements having tapered contact portions 38 which extend into plated through holes 51 of a mother board magnifies the "normal" force relative to the axial holding or mating force. In particular, and by way of example only, if the axial mating force $F_A$ is fifty grams, the axial mating force at each of the two points of contact is seen as twenty-five grams ($F_A/2$). Of course, the mother PCB must assert an equal but opposite force of twenty-five grams at each point. However, the equal but opposite force must be asserted as a component of a force which is perpendicular (i.e. normal) to the point of contact. Thus, at each of the two contact points, the mother board 50 provides a normal contact force $F_N/2$ (shown as the hypotenuse of the triangle). Each normal contact force is the result of two perpendicular forces; an axial force of twenty-five grams opposite to the mating force (as required to provide an equal but opposite force to the axial mating force); and a force perpendicular to the axial force. As will be appreciated, the perpendicular forces to the axial forces are equal and opposite each other and therefore cancel.

Assuming that the contact portion 38 tapers at an angle of fifteen degrees relative to the axial direction, in order for a twenty-five gram axial force opposite to the axial mating force to be generated at each point of contact, a resultant normal force ($F_N/2$) of one hundred grams (twenty-five grams divided by the sine of fifteen degrees) is generated at each point. Thus, for a pin having a total axial mating force of fifty grams, the normal force generated is two hundred grams. More generically, the normal force generated at each point of contact is equal to the axial force at that contact point divided by the sine of the taper angle $\theta$ of the tapered contact portion 38 of the pin 20. The smaller the taper angle $\theta$, the larger the normal force generated. Regardless of the taper angle, the total normal force generated by all the contact points is always greater than the axial insertion force as $F_N//F_A = 1/\sin\theta$.

Returning to FIGS. 1, 2a, 2b, and 3a-3c a single piece dielectric housing 30 is seen. The housing 30 includes side walls 60 which separate and electrically insulate each column of contact pins 20; the side walls 60 extending perpendicularly from top wall 62. Also extending perpendicularly from top wall 62 is front wall 64 having a plurality of openings 66 for permitting at least a portion of tapered contact portions 38 (and preferably the entire tapered contact portion) of contact pins 20 to extend therethrough. Openings 66 are preferably tapered funnels which are arranged to interact with the angled portion 37 of the second ends 34 of the contact pins as will be hereinafter described. Extending rearward from the front wall 64 in a manner parallel to top wall 62 are a plurality of pin separation walls 68 (also called "guide walls") which guide the second ends 34 and contact portions 38 of pins 20 into their preloaded position, and electrically insulate one pin contact from another. Because different rows of pins 20 traverse different lengths (as seen in FIGS. 1 and 3a), the lengths of separation walls 68 are varied accordingly. Preferably, each guide wall extends slightly past the middle bent portion 36 of the pin contact below it, but only as far as the second end 34 of the pin above it.

FIG. 3b explores the axial and lateral tolerances built into the connector contact pins relative to the holes of the mother board. As shown, when the contact pins are not engaging the mother board, angled portions 37 contact the funnel-like openings 66 and thereby center themselves therein in a nominal position. By arranging openings 66 to be smaller in cross section than the cross section of the widest part of angled portion 37, the openings 66 act as a stop to the contact spring pins 20 to cause the spring pins to be preloaded in the housing, as will be discussed hereinafter. In the preloaded position, the contact portions 38 of the pins 20 extend out of the housing 30 by a desired amount. When the contact pins 20 engage the mother board holes, the pins 20 are pushed backward (as seen in phantom) such that the angled portion 37 of the second ends 34 of the pins no longer contacts the funnel-like openings 66 of the housing 30. As a result, lateral movement of the second end of the pin is expedited in all directions, as the passage for the second end of the pin defined by adjacent side walls 60 and adjacent guide walls 68 of the housing 30 is wider than the second ends 34 of the pins. As will be appreciated by those skilled in the art, the further pins 20 are pushed backward, the more second ends 34 can move laterally in any direction in the housing passage.

As a result, a tolerance zone or range for the misalignment of a pin relative to a hole is provided which can approach the radius of the hole in size (provided the housing passage and funnel-like opening are large enough). Also, as seen in FIG. 3b, the tapering of the contact portion 38 of pin 20 provides tolerance relative to the hole diameter, as contact along the tapered surface of the contact portion 38 is guaranteed.

Figure 3C:
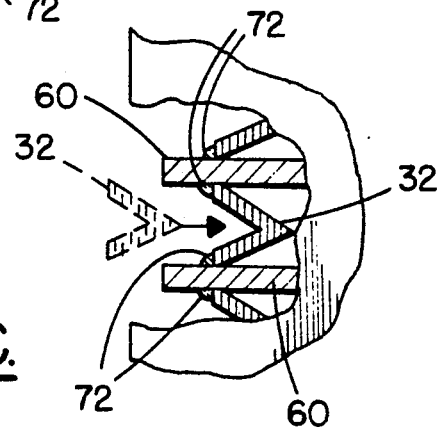
Figure 3A:
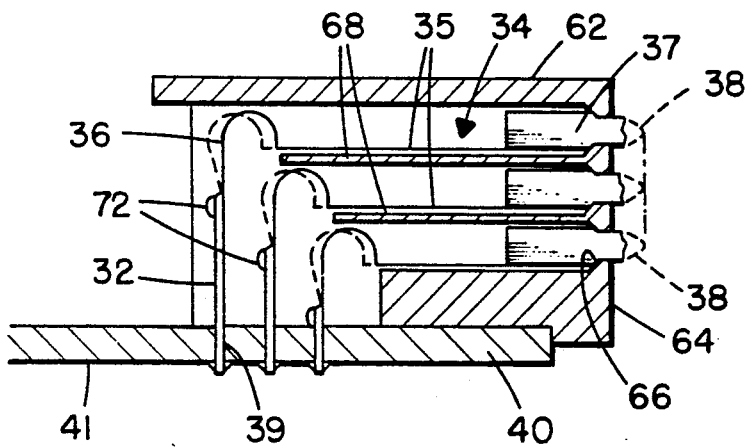
FIG. 3a is a cross sectional view of the first embodiment of the connector invention through the A—A of FIG. 2b.

As seen in FIGS. 1, 3a, and 3c, side walls 60 of housing 30 preferably include side-wall locking tabs 72 (preferably two per contact) which hold adjacent rows of contacts in a preloaded manner at different fixing points relative to the daughter board 40 but at identical fixing points relative to the ninety-degree bend portion 36 of the contact elements 20. The locking tabs 72 provide a restriction between adjacent side walls 60 through which the V-shaped first end 32 of pins 20 are forced during assembly. After the v-shaped first end 32 deforms and passes through the tabs 72, they cannot return past the tabs 72. Thus, locking tabs 72 act to provide a preload to the spring contact elements 20 as the spring contact elements 20 are fixed in location on one end by the contact of angled portion 37 with the funnel-like opening 66, and on the other end by locking tabs. The locking tabs 72 also act to establish a fixing point which fixed a portion of first end 32 (the portion between the locking tab 72 and the daughter board) against movement in the axis of insertion. As a result, the tabs 72 act as a strain relief for the first end 32—daughter board solder joint, as the first end 32 will not substantially move below tab 72. The v-shape of first end 32 also helps to stiffen first end 32 and to prevent movement at the solder joint.

By locating the locking tabs 72 such that pins of different rows have approximately the same spring length between the fixing point and the bend (as seen in FIGS. 1 and 3a), equal bearing forces between the contact portions 38 of pins 20 of different rows of the connector and the holes 51 of the mother board 50 are assured.

Figure 2A:
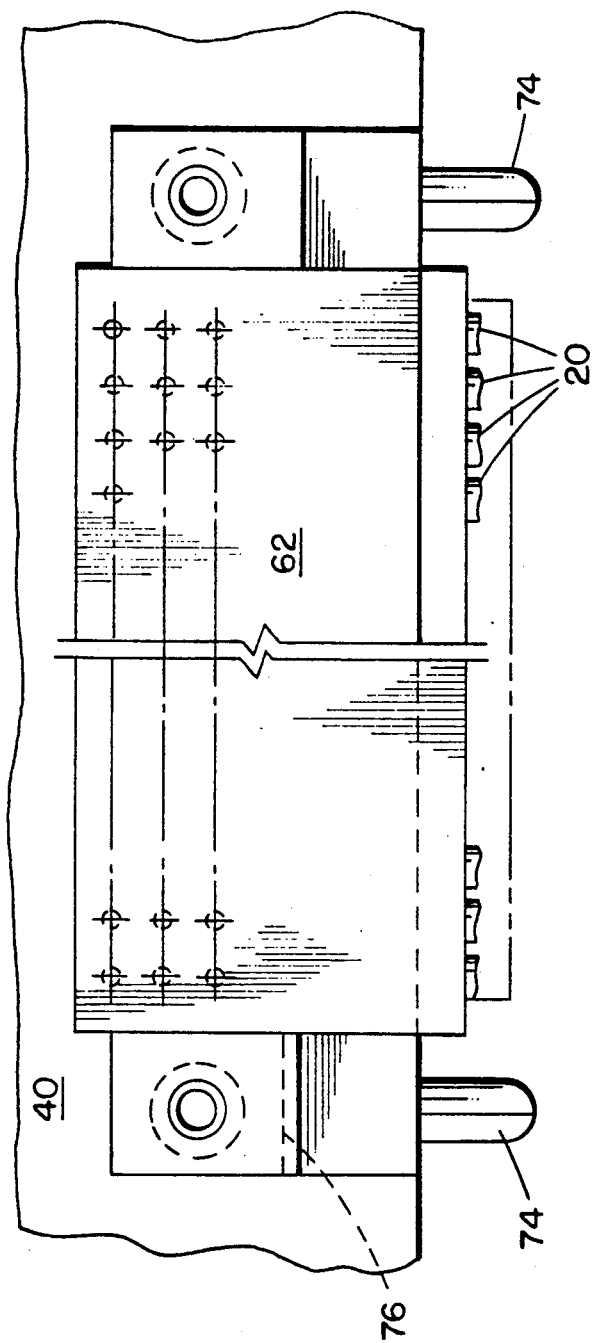
FIG. 2a is a top view of the first embodiment of the connector invention showing a row of contact elements with second ends extending appropriately out of the housing.
Figure 2B:
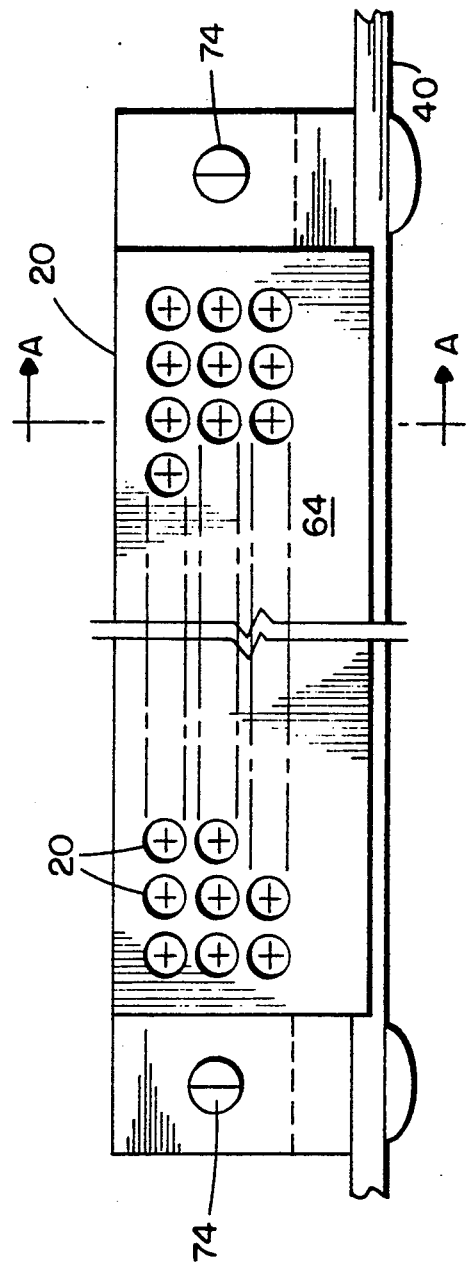
FIG. 2b is a front view of the first embodiment of the connector invention.

Housing 30 may also include at least one integral guide pin 74. Guide pin 74 may act as a ground pin by having a ground wire (not shown) wrapped around it, and/or a make first pin for the connector. Typically, and as shown in FIGS. 2a and 2b, two guide pins 74 are located on either end of the connector and extend along the same axis as the second portion of pins 20. Preferably, the guide pins extend out further than the contact portions 38 of pins 20 and thus act in a shielding or protective capacity, although other protective means such as retractable shrouds (e.g. live hinges or protective flaps) could be utilized. The guide pins 74 are preferably arranged such that they extend into mating holes in the mother board, with the diameter of the mating holes being as large as or slightly greater than the diameter of non-tapered section of the guide pin. While at least one guide pin is preferably integrally molded with the connector, other guide pins may have a threaded end, and are held in place in the housing 30 by rivets 76. If desired, first and second guide pins may be oval in cross-section and oriented perpendicularly with respect to one another. In this manner, one guide pin acts as a horizontal guide, while the other acts as a vertical guide.

Turning to FIGS. 5a-5f, six different spring contact elements 220a, 220b, . . . which are useful for parallel board to board connectors are seen. Each of the spring contact elements 220 has a first tapered end 221, a middle portion 236, and a second tapered end 223. The tapered ends 221 and 223 are used to mate with the conductive rims of a board. The middle portions 236 of each of spring contact elements 220a, 220b, . . . effectively provide the spring action when the spring contact elements are loaded in a housing. The middle portion 236a of spring element 220a of FIG. 5a is a u-shaped spring, while the middle portion 236b or spring element 220b of FIG. 5b is a z-shaped spring. The z-shaped spring provides some symmetry as opposed to the u-shaped spring. Middle portions 236c and 236f of spring elements 220c and 220f are s-shaped springs which also provide symmetry. In addition, with the severe s-shape of spring element 220f, when tapered ends 221f and 223f are pressed together, the s-shaped middle portion 236f actually decreases in width rather then increasing as would be the case with the spring elements of FIGS. 5b and 5c.

The middle portion 236d of spring element 220d of FIG. 5d is a bellows (i.e. a continuous u-shaped spring) which has low inductance and hence a different electrical characteristic than the other spring elements. The middle portion 236e of spring element 220e of FIG. 5e, is formed by welding the tails of two identical single tapered elements together at weld 229. With spring element 220e, the connection of parallel boards having different spacings can be accommodated with a single contact element tooling, as the tails may be welded at different points to form spring elements of different lengths. It should be appreciated that the locations of joining of the tapered ends 221 and 223 to the middle portion 236 in each of the spring elements of FIGS. 5a–5e are preferably chosen to provide the most stability for the spring element; i.e. to reduce torque to a minimum when the tapered portion mates with a rim.

Figure 5G:
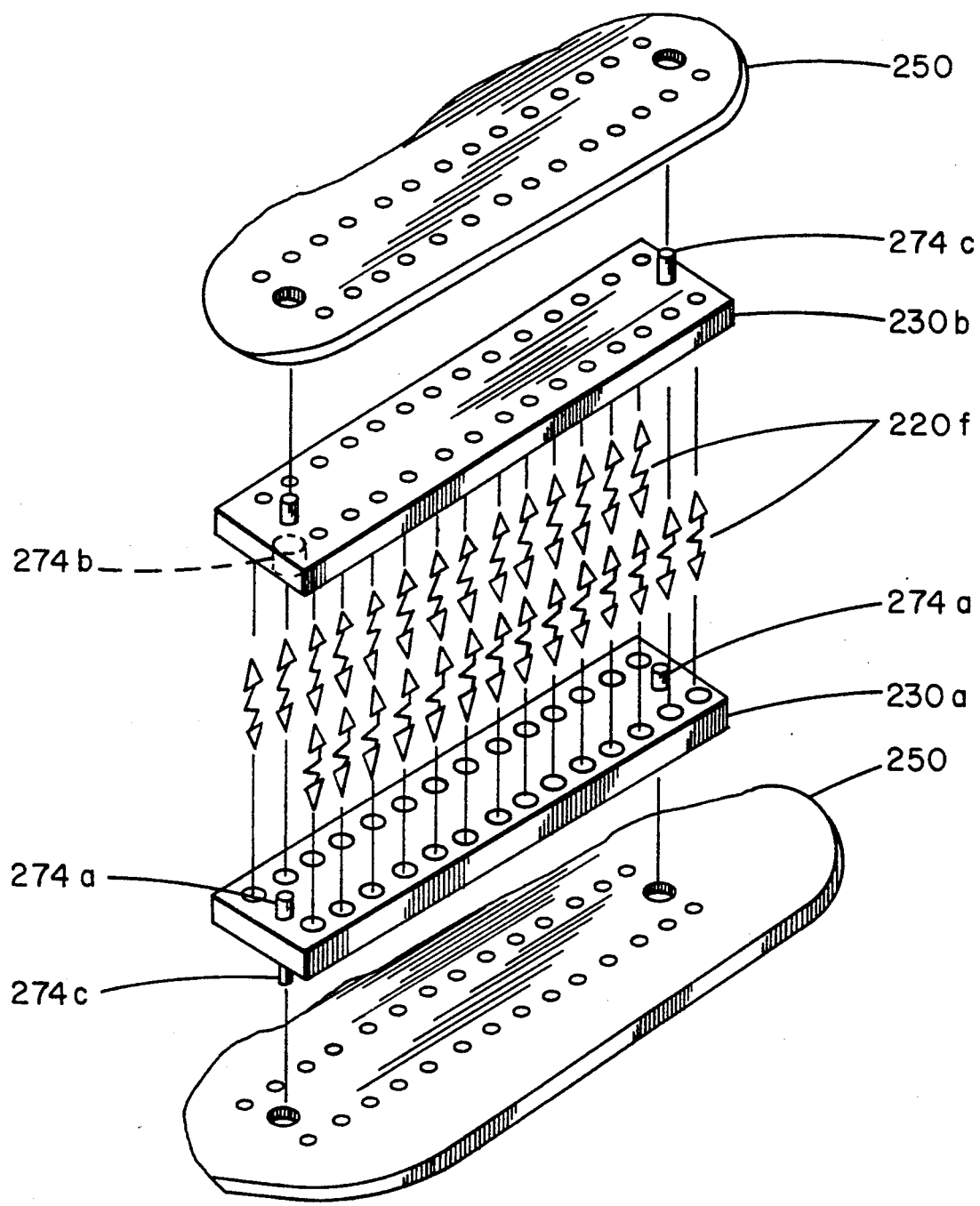
FIG. 5g is an exploded view of a second embodiment of the connector invention having a housing and utilizing the contact of FIG. 5f.

Turning to FIGS. 5g and 5h, a connector with a plurality of spring contact elements 220f and a two piece housing 230 is seen. As seen in more detail in FIG. 5h, each piece 230a and 230b of housing 230 has a plurality of holes in which the tapered contact and the middle portion of the spring is housed. In particular, the holes of the housing are comprised of a tapered section 237 through which the tapered contact (221 or 223) extends, and a larger opening 239 in which the s-shaped spring 236f is housed. Enough room is provided in opening 239 to guarantee that the s-spring 236f will not touch the housing in its preloaded and mating positions. Pieces 230a and 230b of housing 230 may be identical, assembled back-to-back, and held together via sonic welding, glue, or other means. On the other hand, if desired, pieces 230a and 230b may be provided with reciprocating posts 247a and post receivers 274b for a friction or press fit. Regardless, the housing 230 preferably includes posts 274c which act as guide pins for mating with circuit boards 250.

Figure 6D:
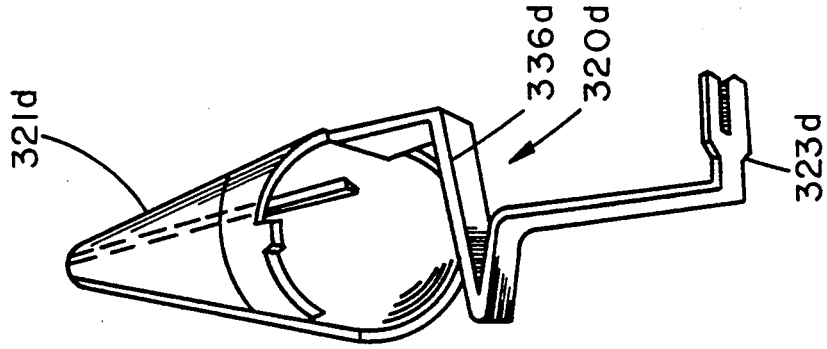
FIG. 6a–6d are diagrammatic representations of four different embodiments of the tail portion of the contact element of the invention.
Figure 6C:
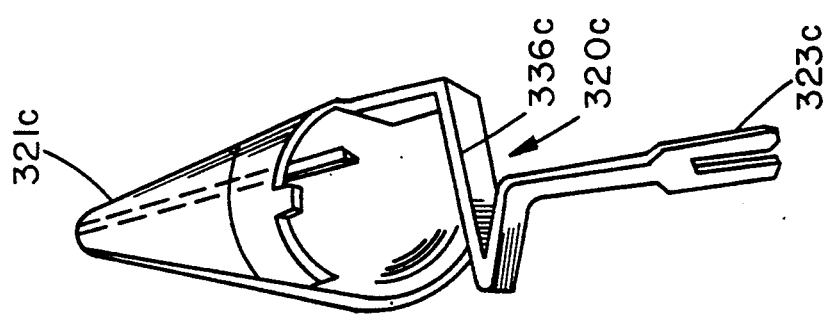

It should be appreciated that the spring contact elements of FIGS. 5a–5f may be provided with two tapered ends for tapered-end-to-rim mating with holes of two boards, or may be provided with one tapered end for tapered-end-to-rim mating and a second end (tail portion) with a different configuration for connection or mating to any desired conductive device. Examples of spring contact elements with different tail portions are seen in FIGS. 6a–6d. In FIG. 6a, a spring contact element 320a is shown with a tapered contact portion 321a for mating with the conductive rim of a hole in circuit board 350b, a spring portion 336a, and a tail portion 323a. The tail portion 323a includes a solder tail 301 and a stop 302, with the tail 301 being arranged to be press fit and/or soldered into a hole 303 (as seen in FIG. 6e) of circuit board 350a, or surface mounted (SMT) on the board surface. The connector utilizing the contact 320a, as seen in FIG. 6e, has a one piece housing 330 with a tapered opening 337e for the tapered contact portion 321a, and an opening 339e of slightly larger width for housing the spring 336a. Guide pins 374c are provided for mating with holes in circuit boards 350a and 350b.

Figure 6B:
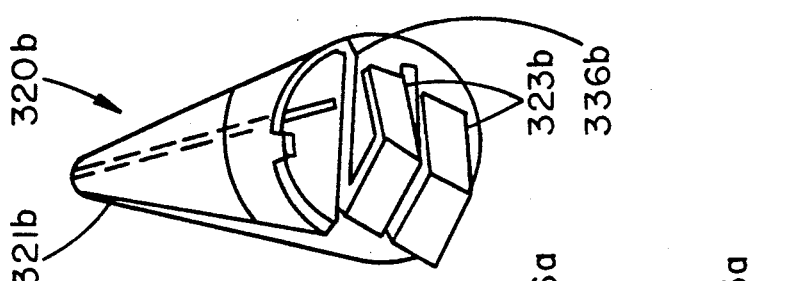
Figure 6A:
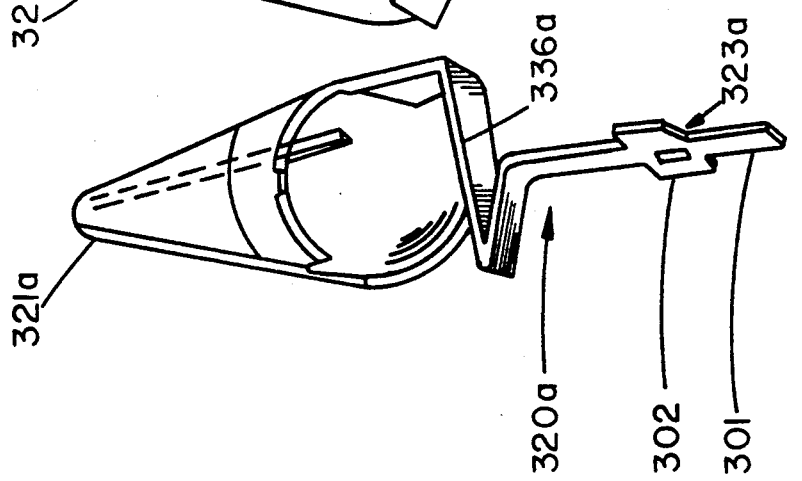

The spring contact element 320b of FIG. 6b, also includes the tapered contact portion 321b, a spring portion 336b, and a tail portion 323b. However, the tail portion 323b is effectively part of the spring portion 336 and provides preloading to establish electrical contact with a conductive pad, wire, or surface. The tail portion 323b may be a single piece or bifurcated as shown in FIG. 6b. Spring contact element 320b is easily formed and plated on a carrier strip (shown in FIGS. 6f–6h) which may be broken away when the tapered contact portion 320b is inserted into a suitable housing 330.

Figure 6F:
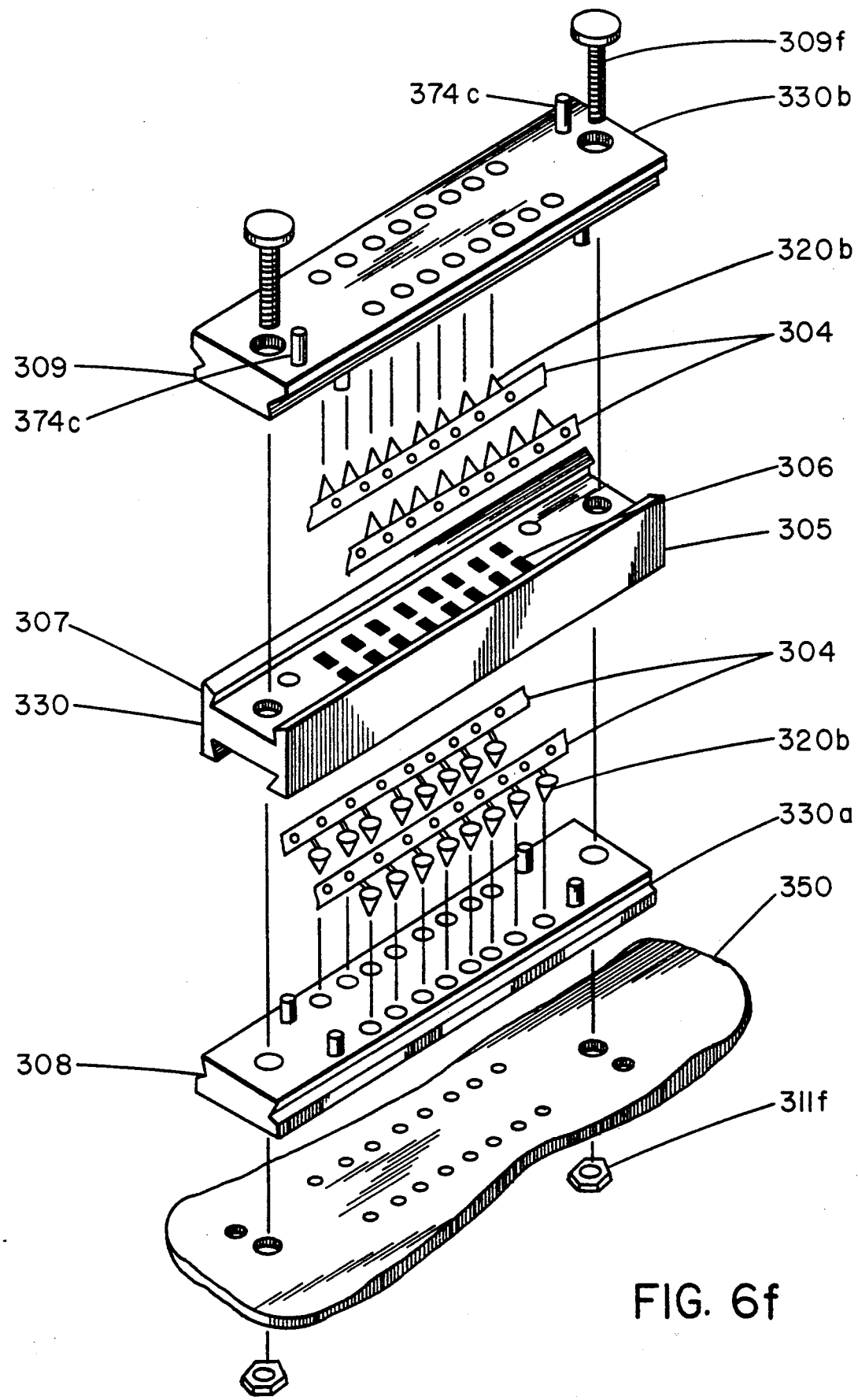
FIGS. 6f–6h are exploded views of different connectors according to the invention utilizing the contact element of FIG. 6b.
Figure 6G:
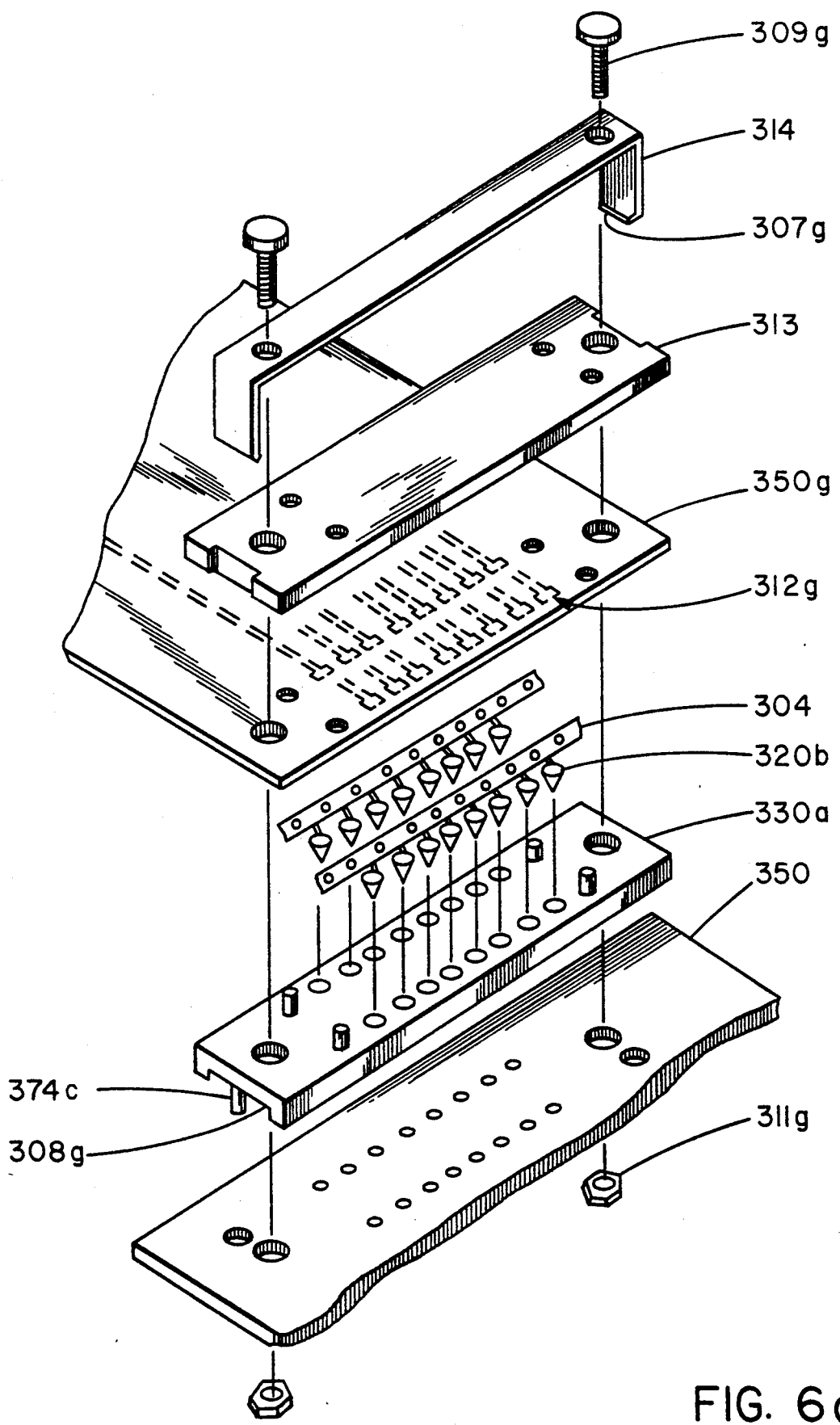
Figure 6H:
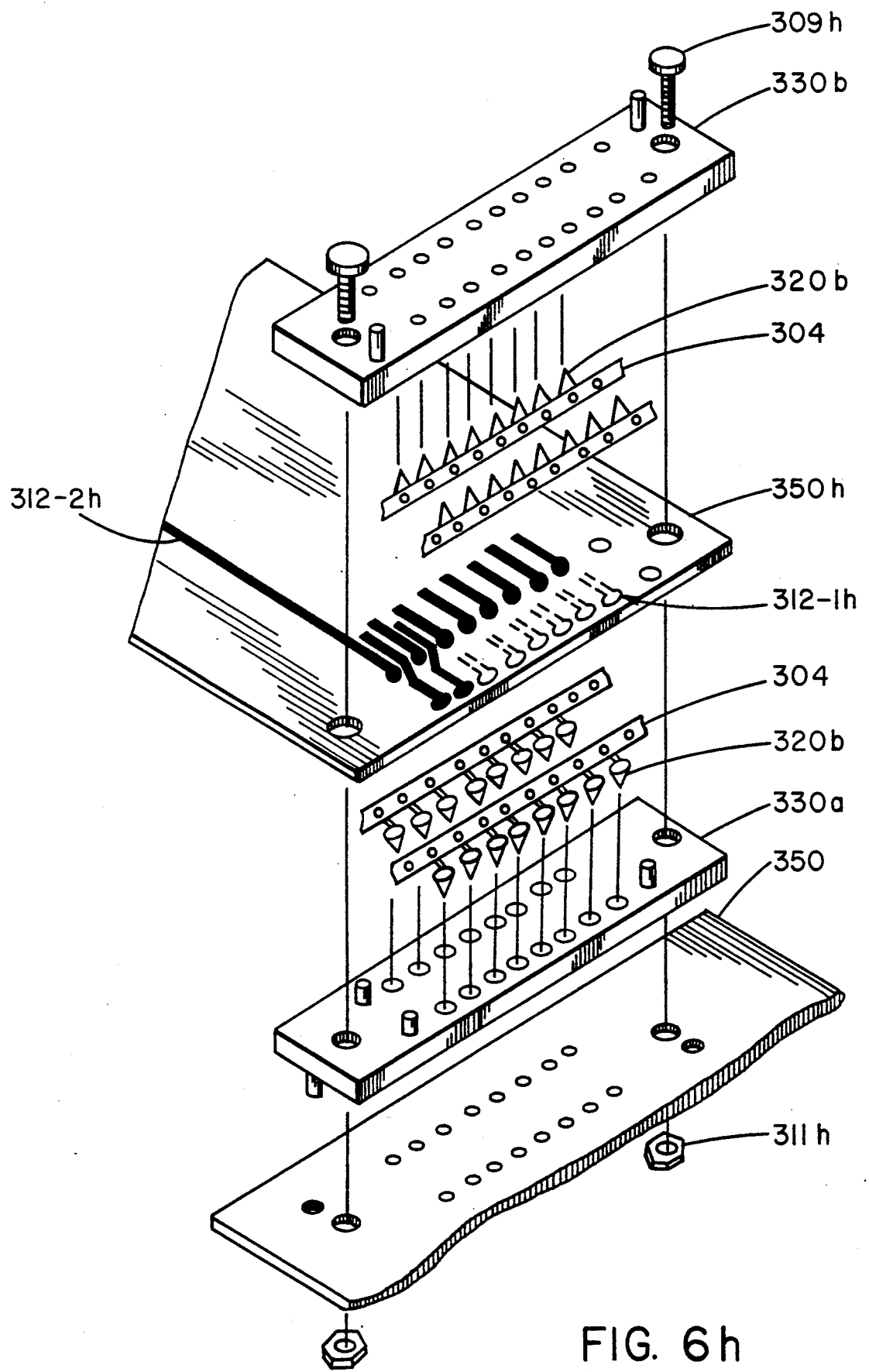

As seen in FIGS. 6f–6h, the spring contact element 320b is advantageously used in several different manners. In FIG. 6f, a connector which can connect two aligned circuit boards is shown. The connector includes two sets of tapered contact elements 320b (shown with their carrier strips 304 which are removed upon loading), a spacer 305 with conductive pads or wires 306, and a housing 330 having pieces 330a and 330b. The spacer 305 is provided with shaped rails 307, and the housing pieces 330a and 330b are provided with grooves 308 for permitting housing pieces 330a and 330b to be snapped into spacer 305 to form a unitary assembly. If desired, the connector housing and spacer as well as the circuit board 350 may be provided with holes to permit the connector to be attached to the circuit board via screws 309f and nuts 311f. Guide pins 374c may also be provided. When loaded, the tails 323b of contact element 320b are in contact with different wires or pads 306 of the spacer 305. The spacer 305 includes internal connective wires to electrically connect each pad 306 on one side of the spacer to one or more associated pads on the other side of the spacer. The spacer 305 may be manufactured to different thicknesses to accommodate different board to board spacings.

FIGS. 6g and 6h show the spring contact element 320b used in a PC board to surface mount board connector and in a PC board to flex circuit connector. In FIG. 6g, the surface mount board 305g having bottom side circuit pads 312g is included in the connector by providing a plastic strain relief piece 313 and a metal clip 314 which sit atop the the SMT board 305g and are held by nuts 311g and screws 309g which extend therethrough and through the housing 330a and PC board 350. The metal clip 314 is provided to maintain flatness and contact force. Rails 307g on the metal clip 314 grab grooves 308g on the housing 330a for a snap fit.

As seen in FIG. 6h, a flex circuit 350h, which includes top and bottom pads 312-1h, and 313-2h, is incorporated into a connector. The connector of FIG. 6h also includes two sets of contact elements 320b carried on carrier strips 304, housing pieces 330a and 330b. When the contact elements 320b are placed in the housing, 330, the carrier strips are preferably removed. The entire assembly is fastened with screws 309h and nuts 311h in a similar manner to the assemblies of FIGS. 6f and 6g.

Turning to FIGS. 6c and 6d, contact elements 320c and 320d which have tail portions adapted for ribbon cable connection (i.e. insulation displacement) are seen. The contact elements 320c and 320d are substantially identical, except that the tail portion 323c of FIG. 6c is substantially coaxial with the contact portion 321c, while the tail portion 323d of FIG. 6d is substantially perpendicular to the contact portion 321d.

Figure 6I:
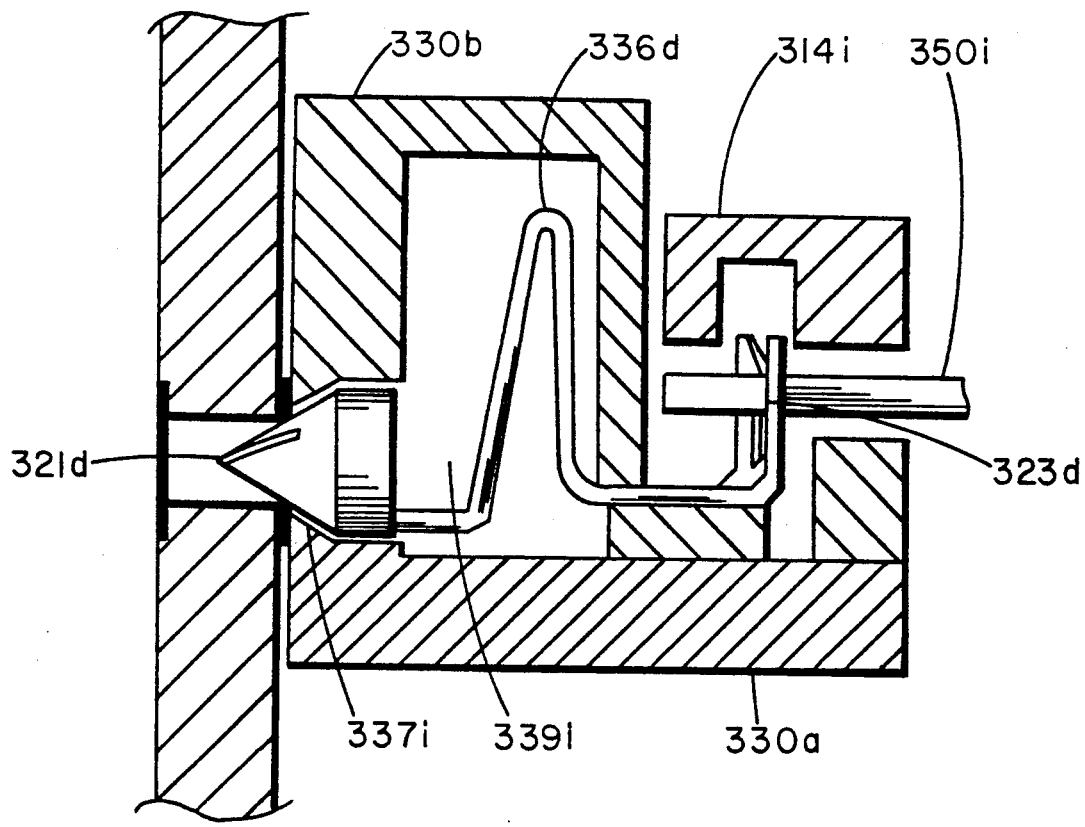
FIGS. 6i and 6j are cross sections through connectors of the invention utilizing the contact elements of FIG. 6d.
Figure 6J:
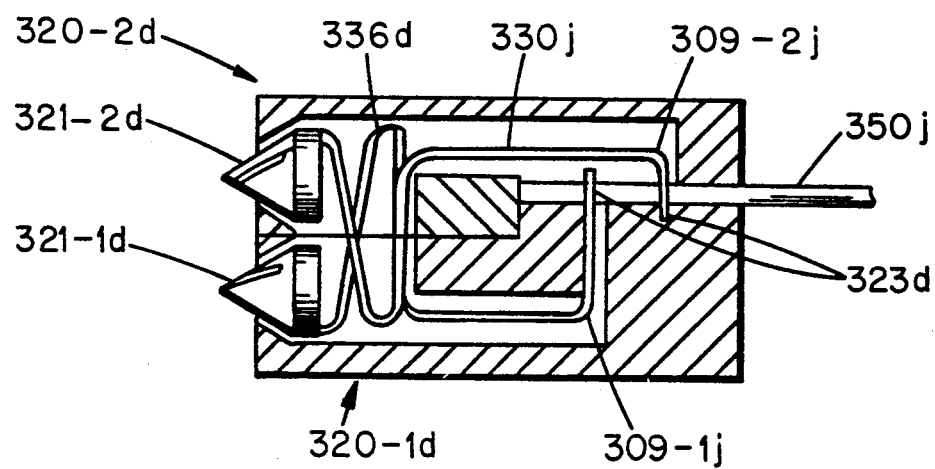
Figure 6E:
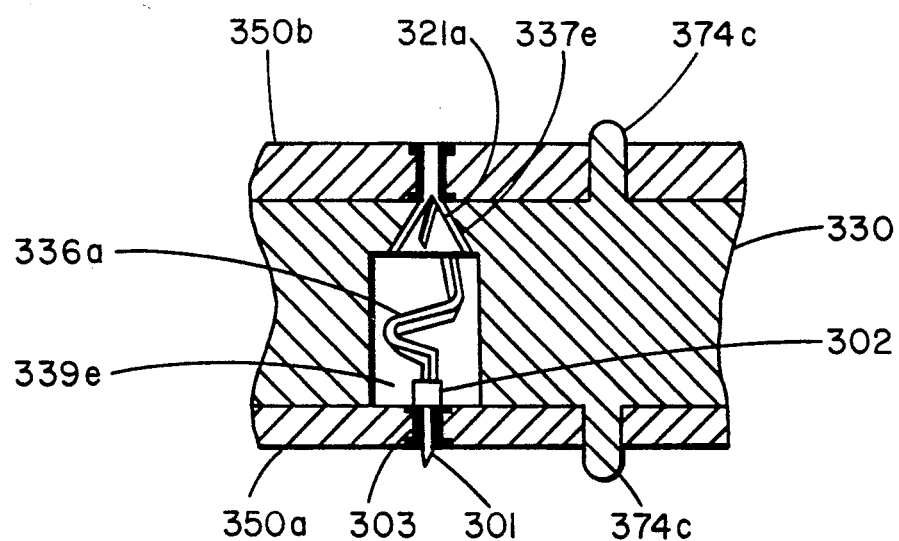

In FIGS. 6i and 6j, the contact element 320d shown in FIG. 6d is used in two different configurations for two different connectors. In FIG. 6i, a two piece housing (330a, 330b) is utilized to house contact element 320d having contact portion 321d, spring portion 336d, and tail portion 323d. The tail portion 323d is perpendicular to the contact portion and has two prongs which act to strip insulation from a ribbon cable 350i. A clamp 314i is provided to guarantee permanent engagement between the ribbon cable 350i and the tail portion 323d of the contact element 320d.

In FIG. 6j, two identical contact elements 321-1d and 321-2d are provided with one of the elements rotated one hundred eight degrees relative to the other, and with the elements having their tail portions 323d bent as different locations (309-1j and 309-2j). With such an arrangement, the insulation stripping tail portions of the adjacent contact elements are not directly adjacent each other; the non-adjacency of contacts between wires of a ribbon cable being a requirement for most ribbon cable connectors due to the proximity of the wires.

Figures 7A, 7B:
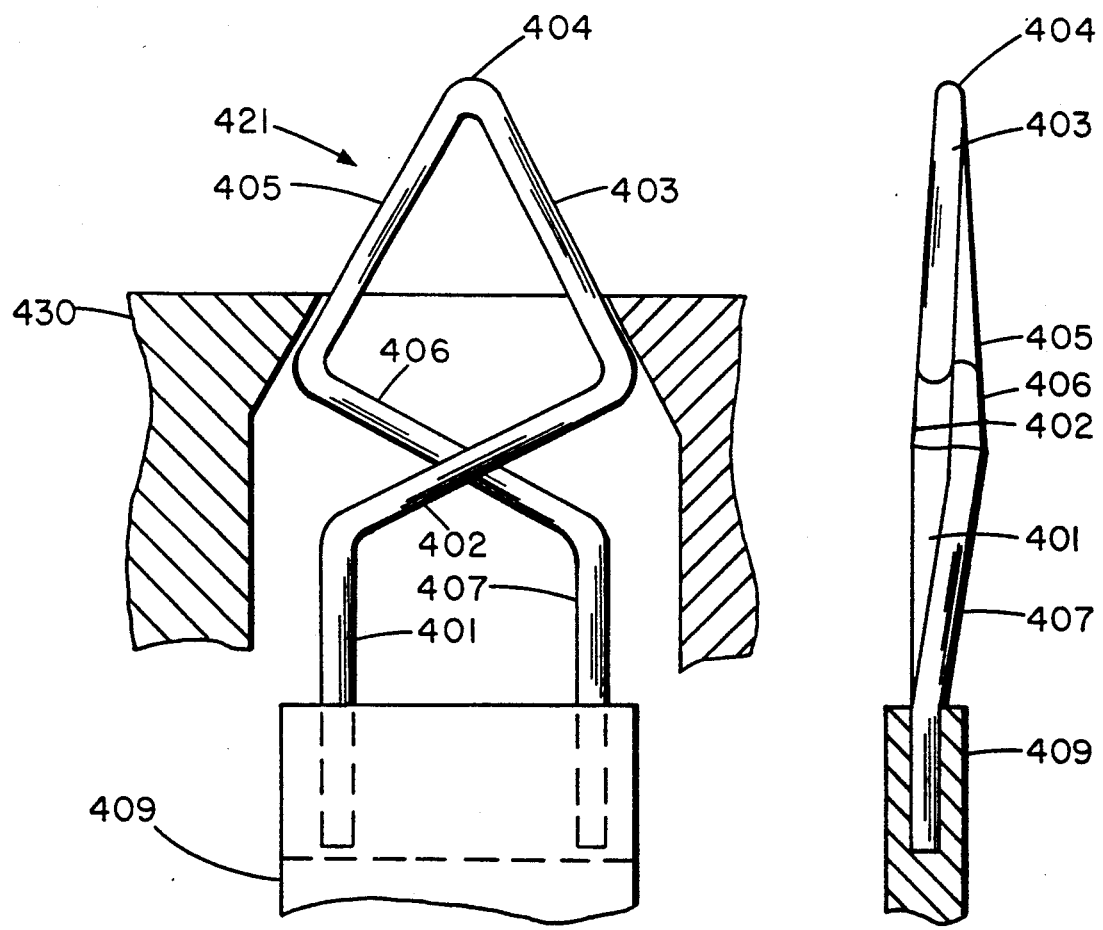
FIGS. 7a and 7b are front and side views of a wire tip embodiment of the contact element of the invention.

Turning to FIG. 7a, a tapered contact element 421 made from wire is seen in a housing 430 with an opening. The tapered contact element 421 is effectively bifurcated with segments 401, 402 and 403 acting as a first portion, and segments 405, 406, and 407 acting as a second substantially independent portion. Segment 401 of the tapered contact element is anchored in a supporting post, and segment 402 is bent at an angle of about one hundred twenty degrees relative to segment 401. Segment 403 is bent at an angle of approximately ninety degrees relative to segment 402 and terminates at point 404 where the second portion of the tapered contact element 421 also terminates. The relative geometries of segments 407, 406 and 405 mirror those of segments 401, 402, and 403. However, as seen in FIG. 7b, the bending of segment 402 relative to segment 401, and segment 406 relative to 407 is slightly different (i.e. opposite) in a second plane such that segments 402 and 406 can extend past each other. As seen in FIG. 7a, segments 402 and 406 touch each other as they extend past each other, although such touching is not required. Likewise, in order that segments 403 and 405 meet at point 404, the bending of segment 403 relative to segment 402 in a second plane is the opposite of the bending of segment 405 relative to segment 406 in that second plane.

With the wire formed tapered contact element 421, the tip 404 has three degrees of freedom. When segments 403 and 405 make contact with the rim of a hole, segments 403 and 405 are pushed backward, causing the angles between segments 401 and 402, segments 407 and 406, segments 402 and 403, and segments 405 and 406 to be decreased, and the angle between segments 403 and 405 to be increased. Thus, when the wire formed tapered contact element 421 engages the rim of a hole, the tapered portion in part compresses and in part retracts and enhances contact. In addition, some rotation of the contact element 421 relative to the rim of the hole can occur which further enhances contact. Effectively, then, because wire formed tapered contact element 421 has a tip which has flexibility in several directions, the tip may act both as the contact portion and the spring portion of the contact element. No spring section is required for contact element 421 beyond the contact portion, although a spring section may be used.

It will be appreciated that the wire formed tapered contact element may be provided with different post assemblies. For example, the segments 401 and 407 can be crimped in a split post 409 as seen in FIG. 7a, force fit or soldered to a post having holes therein, welded to the outside of a round or square post, etc.

It will further be appreciated that depending on the properties of the wire of the wire formed tapered contact element 421 of FIGS. 87a and 7b, and also depending upon the angles between the segments themselves, and the angle between segments 401 and 407 and the post 409, the wire formed tapered contact element 421 may be primarily radially compliant as opposed to being primarily axially compliant like the tapered contact elements of FIGS. 3a, and 5a-5f. In other words, with the arrangement shown in FIGS. 7a and 7b, when the wire formed tapered contact element 421 contacts the rim of a hole, point 404 (the tip) of the contact element moves back very little, as opposed to the point of the bifurcated spring contact portion of FIG. 3a. Rather, the angle between segments 403 and 405 changes so that the segments 403 and 405 (which effectively form a cross section through a tapered cone) are compressed while they ride down the hole. The compression of the "cone" provides a high degree of wipe during mating. In FIG. 3a, there is more axial compliance and less radial compliance (although the bifurcated cone is radially compliant), and as a result, there is less wipe. Thus, depending upon the particular circumstances, it may be desirable to use a connector having a wire formed tapered contact element such as in FIGS. 7a and 7b, or a contact element such as in FIGS. 3a, and 5a-5f which provide more axial compliance. It should be noted, that regardless of the degree of axial versus radial compliance desired, lateral compliance in the contact element is also desired to give alignment tolerance between the contact element and the hole rim.

Figure 8:
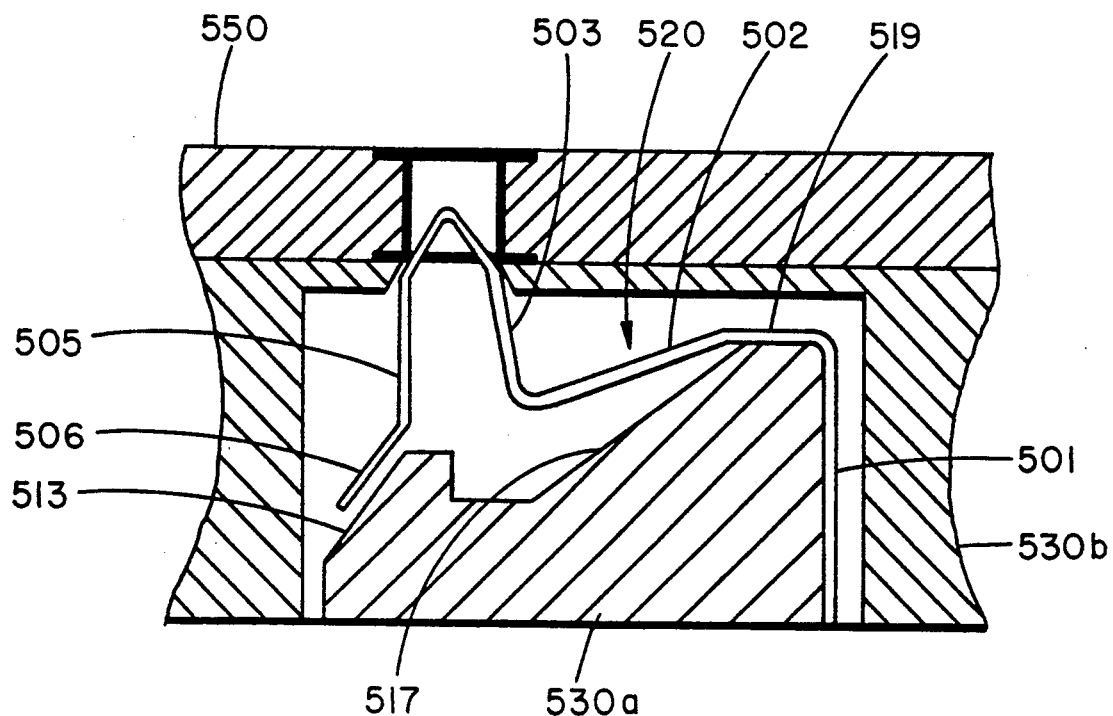
FIG. 8 is a cross-section through a connector of the invention utilizing a wire formed contact element, where the housing of the connector is used as a mandrel for the forming of the spring loaded contact element.

Another wire formed contact element 520 is seen in FIG. 8. In the embodiment of FIG. 8, the housing 530a may be used as a mandrel on which the spring contact 520 is at least partially formed. The wire formed spring contact element 520 includes segments 501, 502, 503, 505, and 506, with segments 503, 505, and 506 preferably preformed. Segment 501 acts as the tail segment and is held in place by housing portions 530a and 503b. In forming the contact element, as indicated in FIG. 8, segment 502 is bent around housing 530a at about ninety degrees relative to segment 501. Then, segment 502 is held against the housing 530a at point 519 and overbent along ramp 517 while segment 506 engages ramp 513 of housing 530a. Upon releasing the contact element at point 519, segment 502 springs back into the position as shown in FIG. 8, while segment 506 disengages ramp 513. With segments 503, 505, and 506 already preformed, the wire formed tapered spring contact element 520 can be used to engage the rim of a hole of a PCM 550 or the like. Upon engaging the rim of a hole, portions 502, 503, 505 and 506 of the spring contact element are forced backward. As a result, portion 506 of the spring contact element 521 engages ramp 513, and portions 505 and 503 are spread relative to each other, thereby enhancing contact and mating.

If desired, the connector of FIG. 8 may have a second section which is the mirror image of that shown. In this manner, board to board connection may be made without having any fixed connections.

Figure 9:
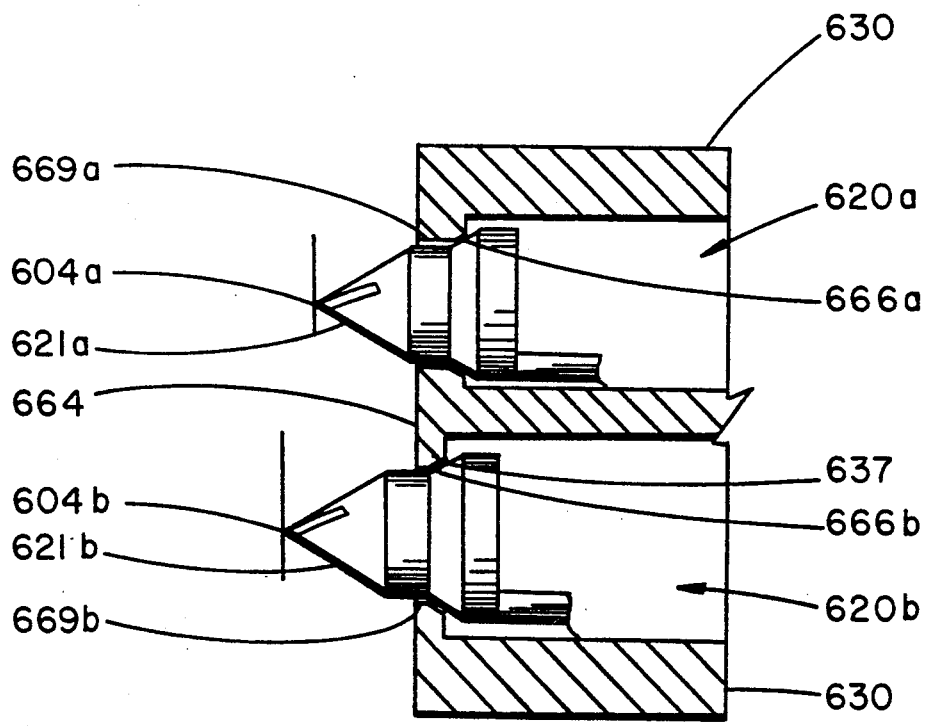
FIG. 9 is a cross section through a housing for a connector of the invention having a first make, last break feature formed by the housing itself.

Because of the tolerances available with the mating of a tapered contact element with a rim of a hole, connectors utilizing such a mating scheme can be readily provided with various first mate (make), last break arrangements. For example, as seen in FIG. 9, a connector is shown with a first contact element 620a having bifurcated conical contact portion 621a, and a second contact element 620b having bifurcated conical contact portion 621b. In accord with the embodiment of FIG. 3b, each contact element has an angled surface 637 for centering and spring loading purposes. Also, the housing 630 for the contact elements includes similarly angled surfaces 666a, and 666b for engaging angled surfaces 637. However, in order to provide a first make, last break arrangement, the angled surfaces 666a and 666b of the housing 630 are not identical. As shown in FIG. 9, angled surface 666b is molded closer to the front face 664 of the housing 630 than is angled surface 666a. This difference is more easily seen by comparing the length of opening surfaces 669a and 669b. As a result of this difference, the contact portion 621a of spring contact element 620a does not extend out of the housing as far as the contact portion 621b of spring contact element 620b; i.e. the tip 604b of contact portion 621b extends further than tip 604a of contact portion 621a. Thus, when mating with rims of a flat surface, contact portion 621b will be the first to mate. When disconnecting, contact portion 621b will be the last to break.

It should be appreciated that other housing arrangements will also provide the first to make, last to break function. For example, instead of changing the location of the angled surface 666 of the housing in which the first to mate contact is housed, that angled surface may be left in the same location but slightly enlarged. Thus, the contact portion 621 of that spring contact element will have to extend further out of the housing before its angled surface 637 engages the angled surface 666 of the housing. Such an arrangement has the advantage that the first to mate contact may be chosen after the connector has been molded, as the angled surface is enlarged via the removal of material. Regardless of the scheme chosen, it should be understood that by varying the housing either during manufacture or thereafter, any particular contact or plurality of contacts may be chosen to provide the first to mate, last to break function. In fact, sequencing can be accomplished in the mating procedure by changing or altering the housing in a plurality of increments.

The first to make, last to break function may also be made by providing a certain spring element with a slightly smaller sized contact portion such that it extends further out of the housing than the contact portions of the other spring elements.

Figure 10:
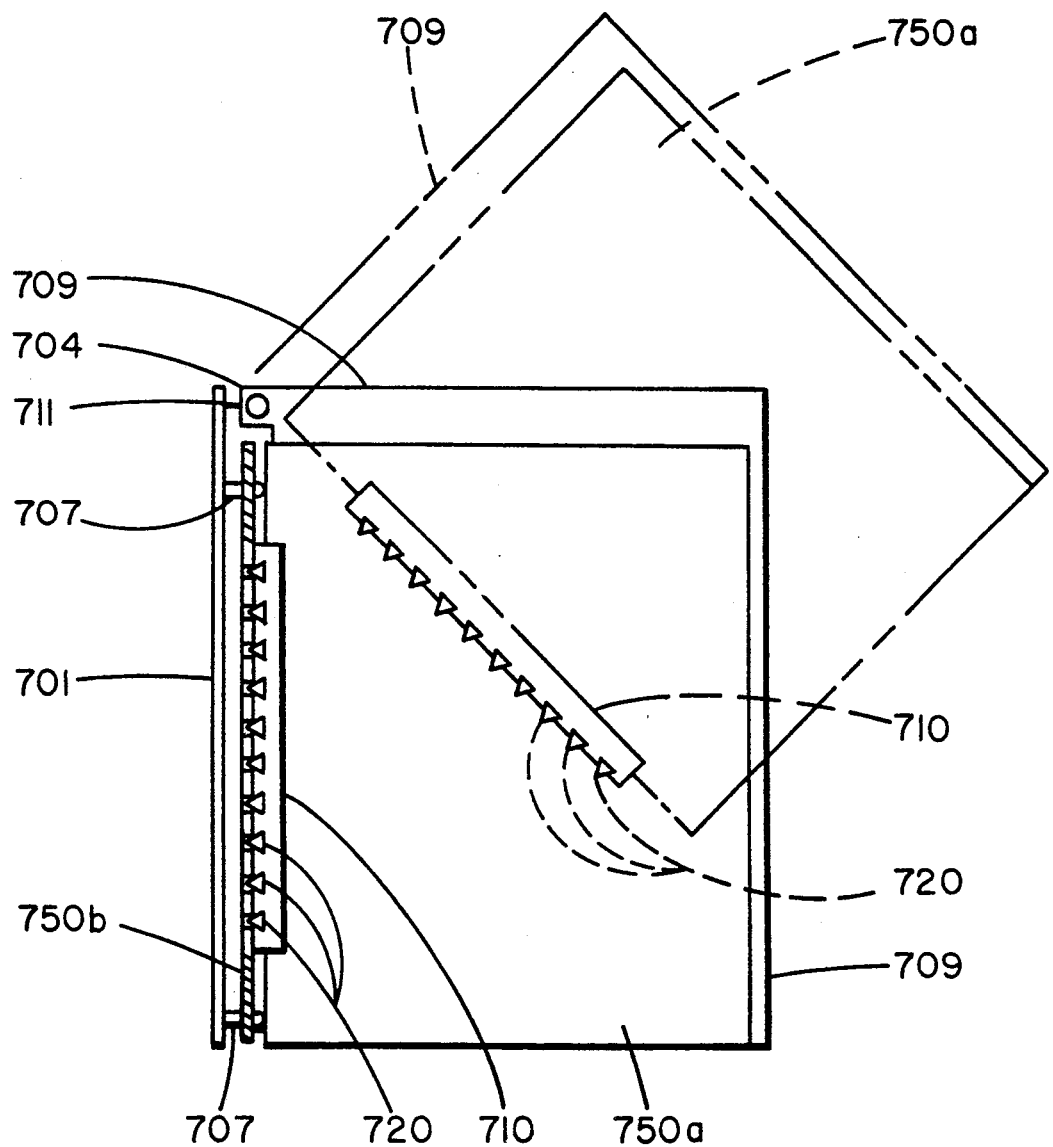
FIG. 10 is a diagrammatic perspective of a connector of the invention utilizing a hinged housing.

Another first to make, last to break arrangement for a tapered contact element connector is seen in FIG. 10 where the particular contact element making first contact is fixed due to geometry. A first circuit board 750a is shown having attached thereto a tapered spring contact element connector 710 with a plurality of contact elements 720. Housing the first circuit board 750a is an open or enclosed modular housing 709 which includes a key slot 711 for pivoting purposes. The connector 710 is provided for connecting the first circuit board 750a to a second parallel or perpendicular circuit board 750b which has holes with conductive rims. The second circuit board 750b as shown is a backplane which is mounted on a rear panel 701 via screws 707. Preferably as part of the backplane 750b, a pivot means 704 is provided around which the key slot 711 fits. Board 750a may then be rotated relative to board 750b such that connector 710 will mate with the conductive rims of board 750b. Because of the rotation, if the contact elements 720 of connector 710 and the rims of the second circuit board 750b are uniform, the contact element 720 closest to the pivot 704 will make first contact upon mating, and break last upon separation. In fact, the contact elements 720 will mate and break in a natural sequence. Of course, the first make, last break function can be accomplished with the embodiment of FIG. 10 even if the contact elements 720 or the housing 730 are not uniform.

The embodiment of FIG. 10 is useful in mating a printed circuit board to a backplane. It is also useful in mating two circuit boards, in mating a cable to a circuit board, in mating two cables, etc.

Figure 11A:
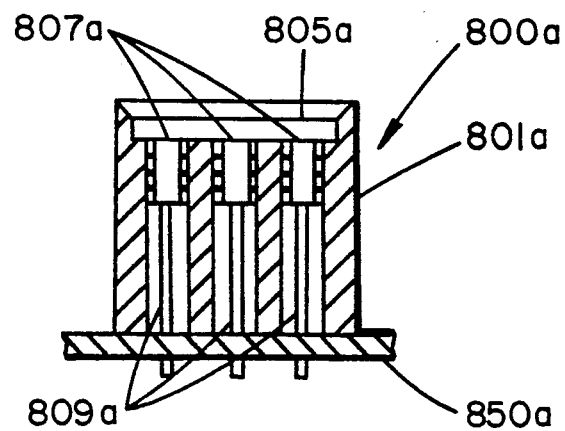
FIGS. 11a and 11b are cross sections through a straight through embodiment and a perpendicular embodiment of a female mating connector for the connector of the invention.
Figure 11B:
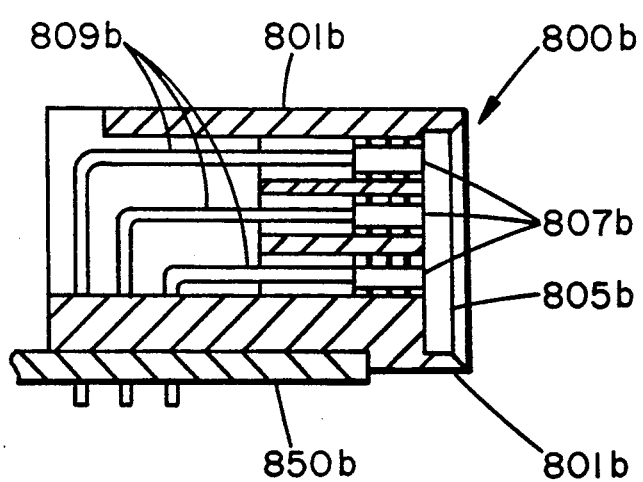

While the connector invention disclosed herein is effective in removing the need for two connector parts, it will be appreciated that in some situations, it may be desirable to provide a mating female connector part for the male connector which has the tapered spring contact elements. Two embodiments of such a female connector are seen in FIGS. 11a and 11b. In FIG. 11a, a straight through female connector 800a is seen with a housing 801a. The female connector 800a has a recessed entry area 805a, a plurality of holes 807a (preferably with straight sides) having plated rims, and a plurality of conductor elements 809a electrically coupling the plated rims to a circuit board 850a. As shown in FIG. 11a, the tail portion of the conductor elements 809a are press fit and/or soldered to the circuit board 850a. However, it should be appreciated that the tail portion of the conductor elements 809a can take other forms such as an insulation displacement tail, a surface mount tail, or a wire crimp tail, which can be used for connection to one or more of a board, a wire, a ribbon cable, or a flex-circuit.

The female connector 800b of FIG. 11b is very similar to that of connector 800a, except that the conductor elements 809b traverse approximately ninety degrees in coupling the plated rims to the board 850b, and the housing 801b is changed to accommodate the same.

Figure 12:
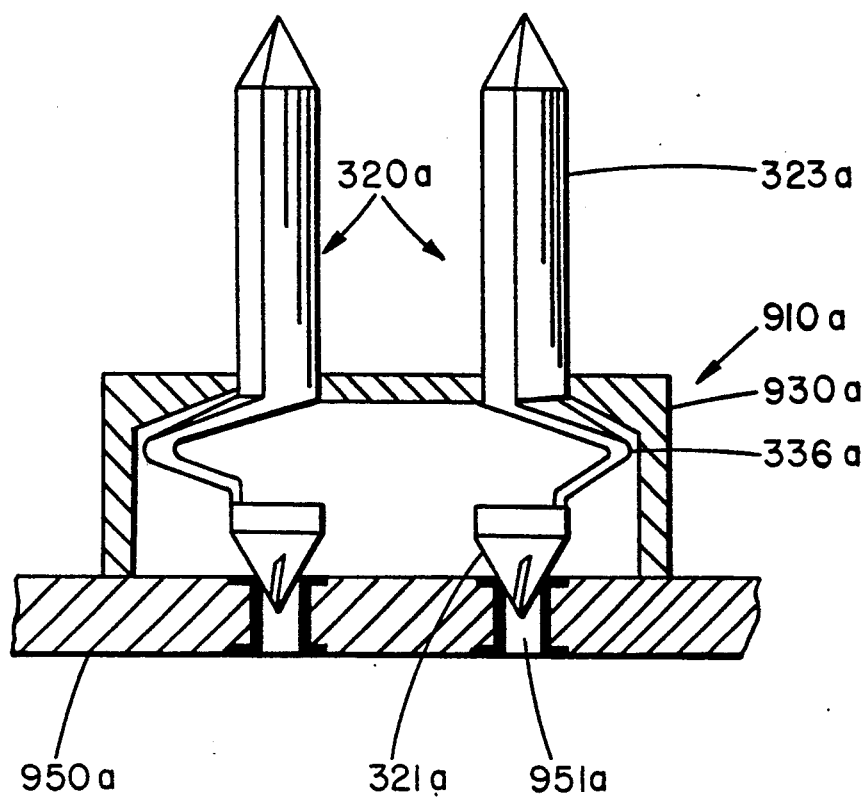
FIGS. 12a and 12b are cross sections through nonsolder straight and right angle permanent connectors respectively.
Figure 12:
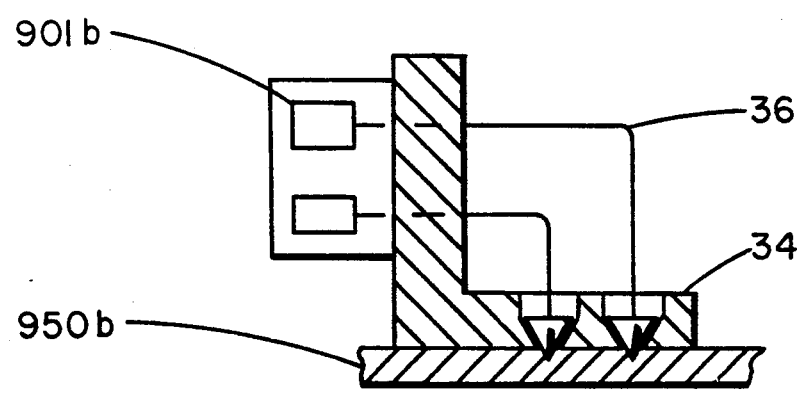

While the connector of the invention utilizing spring contact elements with tapered end portions is applied advantageously to connectors which are removable and reattachable, it should be appreciated that the teachings contained herein may further be used for permanent non-solder connections. As seen in FIG. 12a, a permanent non-solder connection is made between a PCB 950a and a pin- or post-header type connector 910a having spring contact elements 320a such as previously described with reference to FIG. 6a (with contact portion 321a, spring portion 336a, and tail 332a). The housing 930a via any type of means (not shown) or method such that the tapered contact portions 321a of the spring contact elements 320a are fixed in the holes 951a of the PCB board 950a. With such an arrangement, a base metal system (e.g. tin-lead) for the contact portions 321a and the rims of the holes 951a is believed adequate for proper connection. In fact, it is believed that even for the nonpermanent connectors disclosed above with reference to FIGS. 1–11, a base metal system may be suitable as it is believed that fret corrosion is substantially reduced and possibly eliminated with the tapered contact to hole rim connection provided according to the invention.

A right angle permanent socket type connector is shown in FIG. 12b, which is similar in several ways to the connector of FIG. 12a. However, instead of using the contact elements of FIG. 6a, the contact elements 20 of FIG. 1 are used in the connector of FIG. 12b. Also, instead of the pins 323a, a female contact portion 901b is provided. Contact elements 20 have their tapered portion 34 in permanent contact with the holes 951b of PCB board 950b. As shown in FIG. 12b, the female contact portion 901b is substantially in the format of the female connector 800a of FIG. 11a. Of course, with the connectors of FIGS. 12a and 12b, any tail geometry or spring geometry such as shown in FIGS. 5a–5f and 6a–6d could be utilized. The spring tip of FIGS. 7a and 7b could likewise be utilized.

Figure 13:
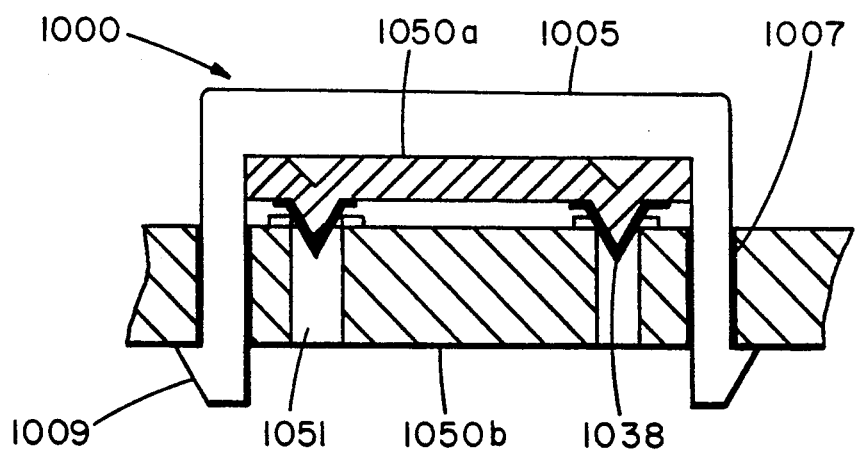
FIG. 13 is a cross section of a flex-print to board connector utilizing the tapered contact to conductive rim mating according to the invention.

Turning to FIG. 13, a flex print to board connector 1000 according to the concepts of the invention is seen.

The flex print 1050a is embossed with a conductive tapered contact portions 1038 which are designed to mate with the conductive rims of holes 1051 in board 1050b. A one piece preformed plastic bent beam spring 1005 is provided to hold the flex print 1050a down on the board 1050b, and hence the contact portions 1038 in engagement with the rims of the holes 1051. Board 1050b is also provided with mating holes 1007 for permitting legs 1009 on the bent beam spring 1005 to extend through and grab the board 1050b.

Figure 14:
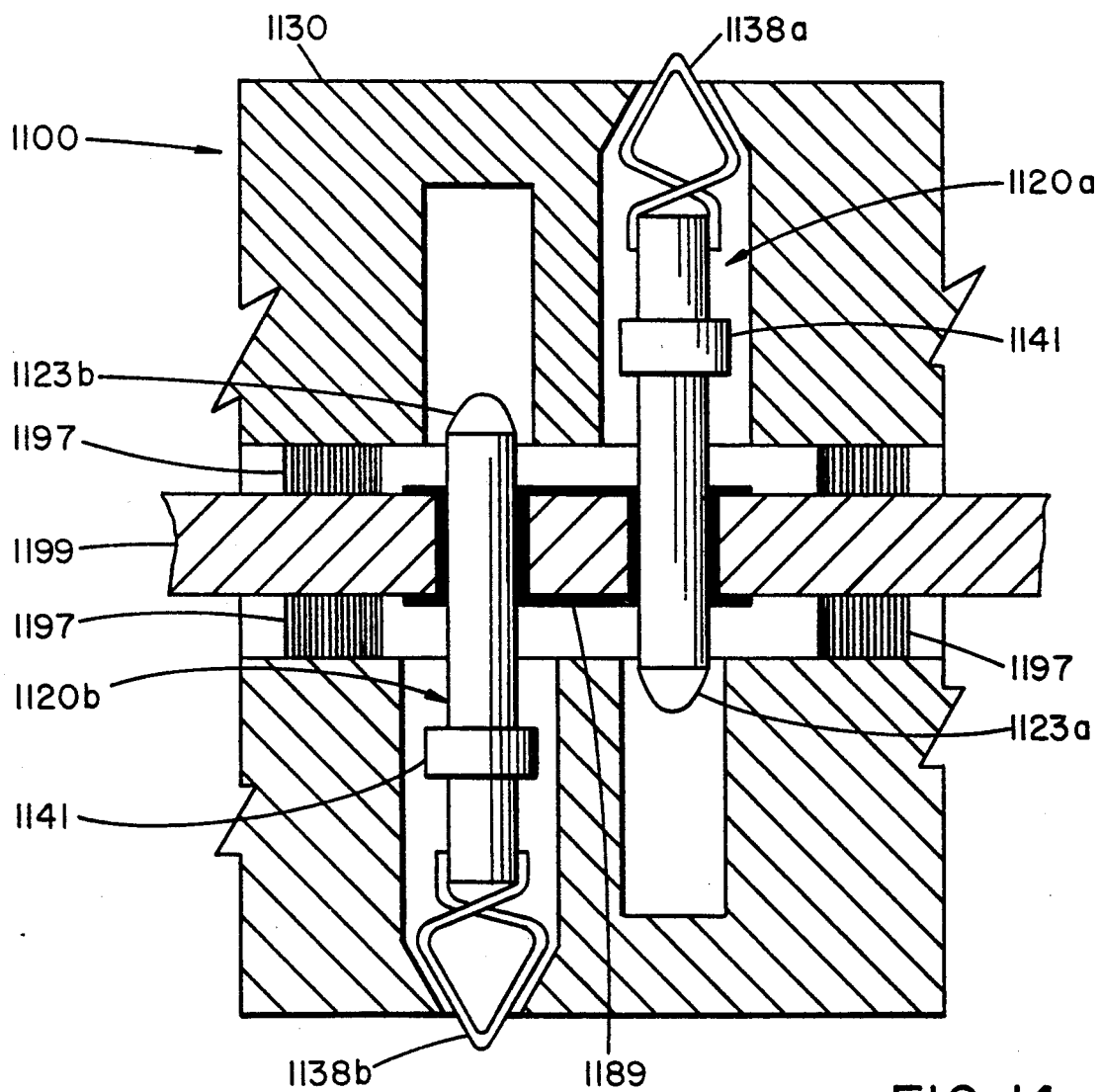
FIG. 14 is a cross section of a connector useful for board to board applications where different board to board distances are accommodated.

The connector 1100 of FIG. 14 is useful for board to board applications where different board to board distances are accommodated. Connector 1100 is shown with housing 1130, contact elements 1120a and 1120b having tail portions 1123a and 1123 extending through an intermediate board 1199, and a shim 1197. Contact elements 1120a and 1120b are wire formed tapered contact elements with a tapered spring contact end 1138, a stop 1141, and a tail 1123. The tails 1123 may be press fit into board 1199 to provide a desired effective length of the contact elements. Thus, with the connector embodiment of FIG. 14, only one length contact element need be manufactured, as various board-to-board distances may be accommodated. As shown in FIG. 14, shims 1197 are provided to support the housing, and different size shims would be utilized depending upon how far into board 1199, the tails 1123 of contact elements 1120 would be forced. Also, as shown in FIG. 14, conductive paths 1189 are provided between two contact elements 1120a and 1120b where desired.

It should be appreciated that the variable distance connector 1100 of FIG. 14 could be utilized where intermediate board 1199 acts as the second circuit board, and one side of the connector is fixed; i.e. the press fit side is fixed into the circuit board 1199. In such an application, the contact element 1120a provides the conductive path between the boards, and conductive paths between contact elements such as shown as 1189 would not be required.

There has been disclosed herein connectors utilizing tapered spring contact elements for mating with plated rims of an object. While particular embodiments of the invention have been described, it is not intended that the invention be limited thereby, as it is intended that the invention be broad in scope and that the specifications be read likewise. Thus, while board to board, cable to board, board to cable, cable to cable, and other embodiments and applications (e.g. board to wire, surface mount, etc.) have been described, it will be appreciated that the tapered spring contact element connector concept can be used in a multitude of applications, including, but not limited to: terminals; splices; plugs and receptacles; quick connect/disconnect; rack and panel; card edge; pin and socket; mass termination; jumpers; zero insertion force; power terminals; headers; sockets; hermaphroditic; input/output; RF shielded; and terminal blocks. To accommodate different types of connectors, spring elements, housings, and fastening means other than those disclosed, but obvious to those skilled in the art could be utilized. Therefore, it will be apparent to those skilled in the art that other changes and modifications may be made to the invention as described in the specification without departing from the spirit and scope of the invention as so claimed.

We claim:

1. An electrical connector for providing a semipermanent electrical connection between the conductive rims of holes of a first object and the conductive rims of holes of a second object, said first object and second object being substantially parallel each other, said electrical connector for use with a fastening means which fastens said electrical connector to or between said first and second objects, said electrical connector comprising:

a plurality of spring contact element means, at least two of said plurality of spring contact element means being electrically isolated one from the other, each spring contact element means having a first tapered contact portion for mating with a conductive rim of a said hole of said first object, a second tapered contact portion for mating with a conductive rim of a said hole of said second object, and a spring portion coupled to said first and second tapered contact portions, said spring portion being laterally tolerant for permitting at least one of said first tapered contact portion and said second tapered contact portion to move laterally in a substantially free-floating manner so as to seat in the conductive rim of the hole in the object with which it mates; and a dielectric housing for housing said plurality of spring contact elements, said dielectric housing comprising a front wall which is substantially parallel said first object when said electrical connector mates with said first object, said front wall having a plurality of first apertures for permitting at least a portion of said first tapered contact portions of said plurality of spring contact element means to extend therethrough.

2. An electrical connector according to claim 1, wherein:

said dielectric housing comprises a rear wall which is substantially parallel said second object when said electrical connector mates with said second object, said rear wall having a plurality of second apertures for permitting at least a portion of said second tapered contact portions of said plurality of spring contact element means to extend therethrough.

3. An electrical connector according to claim 2, further comprising:

said fastening means for fastening said first object, said second object, and said electrical connector together.

4. An electrical connector according to claim 2, wherein:

said first and second apertures in said front and rear walls are shaped for causing said first and second tapered contact portions to contact said apertures to stop said spring contact element means in desired locations such that said spring contact element means are preloaded.

5. An electrical connector according to claim 1, wherein:
said spring portion is one of a u-shaped, z-shaped, or an s-shaped spring.

6. An electrical connector according to claim 5, wherein:
said spring portion is a u-shaped spring portion, and is formed from two identically shaped spring portions coupled together.

7. An electrical connector according to claim 2, wherein:
said first and second tapered contact portions are bifurcated cones, whereby said bifurcated cones become resiliently compressed as they enter said holes.

8. An electrical connector according to claim 7, wherein:
said first object is a printed circuit board and said second object is a printed circuit board.

9. An electrical connector according to claim 2, wherein:
said dielectric housing comprises a plurality of side walls substantially perpendicular to said front and rear walls for separating columns of said plurality of spring contact elements means, but permitting said spring portion to be laterally tolerant.

10. An electrical connector according to claim 1, wherein:
each of said plurality of spring contact element means is similarly disposed.

11. An electrical connector according to claim 1, wherein:
said first tapered contact portions and said second tapered contact portions are horizontally resilient.

12. An electrical connector for mating with conductive rims of holes of a board, and for use with a fastening means which fastens said electrical connector to said board, said electrical connector comprising:
a) a plurality of contact element means, each of said plurality of contact element means having a first portion for making electrical contact with conductor means other than said circuit board, and each contact element means having a tapered contact portion for mating with one of said conductive rims of said circuit board;
b) a dielectric housing for housing said plurality of contact element means, said dielectric housing comprising a front wall which is substantially parallel said board when said electrical connector mates with said board, said front wall having a plurality of apertures shaped for permitting at least a portion of said tapered contact portions of said plurality of contact element means to extend therethrough and for stopping said contact element means in desired locations such that said contact element means are preloaded; and
c) first make, last break means for causing a particular of said plurality of contact element means to contact a particular conductive rim before others of said plurality of contact element means contact others of said conductive rims.

13. An electrical connector according to claim 12, wherein:
said first make, last break means comprises a particular aperture of said plurality of apertures which is configured differently than others of said plurality of apertures such that a particular contact element means having its tapered contact portion extending through said particular aperture has its tapered contact portion extending out of said dielectric housing further than said others of said plurality of contact element means having their tapered contact portions extending through said others of said plurality of apertures.

14. An electrical connector according to claim 12, wherein:
said first make, last break means comprises a hinge allowing relative rotational movement between said electrical connector and said board.

15. An electrical connector according to claim 12, further comprising:
d) said fastening means for use in fastening said electrical connector to said board to keep said plurality of tapered contact elements mated with said conductive rims.

16. An electrical connector according to claim 12, wherein:
said plurality of tapered contact elements are spring contact elements.

17. An electrical connector for mating with conductive rims of holes of a circuit board, comprising:
a) a plurality of contact element means, each contact element means having a spring portion which makes electrical contact with conductor means other than said circuit board, and each contact element means having a tapered contact portion coupled to said spring portion for mating with one of said conductive rims of said circuit board, each contact element being laterally tolerant for permitting said tapered contact portion to move laterally so as to seat in the conductive rim of the hole in the object with which it mates;
b) fastening means for use in fastening said electrical connector to said board to keep said plurality of tapered contact elements mated with said conductive rims; and
c) a dielectric housing for housing said plurality of tapered contact elements, wherein,
said conductor means other than said circuit board comprises conductive pads on a surface mount board.

18. An electrical connector for mating with conductive rims of holes of a circuit board, comprising:
a) a plurality of contact element means, each contact element means having a spring portion which makes electrical contact with conductor means other than said circuit board, and each contact element means having a tapered contact portion coupled to said spring portion for mating with one of said conductive rims of said circuit board, each contact element being laterally tolerant for permitting said tapered contact portion to move laterally so as to seat in the conductive rim of the hole in the object with which is mates;
b) fastening means for use in fastening said electrical connector to said board to keep said plurality of tapered contact elements mated with said conductive rims; and c) a dielectric housing for housing said plurality of tapered contact elements, wherein, said conductor means other than said circuit board comprises conductive pads on a flexible printed circuit.

19. An electrical connector for mating with conductive rims of holes of a first circuit board, and for connecting said first circuit board to a second circuit board having second conductive rims, comprising:

a) a plurality of first contact element means, each first contact element means having a spring portion which makes electrical contact with conductor means other than said first circuit board, and each first contact element means having a tapered contact portion coupled to said spring portion for mating with one of said conductive rims of said first circuit board, each first contact element being laterally tolerant for permitting said tapered contact portion to move laterally so as to seat in the conductive rim of the hole in the object with which is mates;

b) fastening means for use in fastening said electrical connector to said first circuit board to keep said plurality of tapered contact elements mated with said conductive rims;

c) a dielectric housing for housing said plurality of tapered contact elements; and d) a plurality of second contact element means, each second contact element means having a spring portion which makes electrical contact with said conductor means other than said first circuit board, and each second contact element means having a tapered contact portion coupled to said spring portion of said second contact element means for mating with one of said conductive rims of said second board, wherein said dielectric housing comprises a spacer means containing said conductor means other than said first circuit board.

20. An electrical connector according to claim 19, wherein:

said spacer means comprises a dielectric piece having a plurality of first surface conductive means on one surface of said dielectric piece, a plurality of second surface conductive means on an opposite surface of said dielectric piece, and a plurality of conductive connective means for connecting a plurality of first and second surface conductive means.

21. An electrical connector for connecting conductors of a ribbon cable with conductive rims of holes of a board, comprising:

a) a plurality of contact element means, each contact element means having a insulation stripping tail means for making contact with a conductor of a ribbon cable, a tapered contact portion coupled for mating with one of said conductive rims of said board, and spring means coupling said insulation stripping tail means and said tapered contact portion; and b) fastening means for use in fastening said electrical connector to said board to keep said plurality of tapered contact elements mated with said conductive rims.

22. An electrical connector according to claim 21, further comprising:

c) a dielectric housing for housing said plurality of tapered contact elements.

23. An electrical connector according to claim 22, further comprising:

d) clamp means for cooperating with said insulation stripping tail means for making contact with a conductor of said ribbon cable.

24. An electrical connector for mating with conductive rims of holes of a board, comprising:

a) a plurality of contact element means, each contact element means having a wire formed tapered contact portion for mating with one of said conductive rims of said board, said wire formed tapered contact portion being axially and radially compliant so as to be substantially self-centering upon mating in said conductive rim and so as to provide substantial wipe upon mating in said conductive rim, and said tapered contact portion being formed to angularly engage opposite sides of the conductive rim; and b) fastening means for use in fastening said electrical connector to said board to keep said plurality of wire formed tapered contact elements mated with said conductive rims wherein each said contact element means has a post, said wire formed tapered portion coupled to said post, each post coupled to conductive means other than said conductive rims of said holes of said board.

25. An electrical connector according to claim 24, wherein:

said wire formed tapered contact portion comprises a single wire extending vertically from said post and having five bends, with a first bend of approximately one hundred twenty degrees, a second bend of approximately ninety degrees, a third bend of approximately sixty degrees, a fourth bend of approximately ninety degrees, and a fifth bend of approximately one hundred twenty degrees.

26. An electrical connector according to claim 24, further comprising:

c) a dielectric housing for housing said plurality of tapered contact elements.

27. An electrical connector according to claim 26 for connecting said board to a second board having second conductive rims, further comprising:

d) a plurality of second contact element means, each second contact element means having a wire formed tapered contact portion for mating with one of said second conductive rims of said second board, said wire formed tapered contact portion being both axially and radially compliant, wherein said conductive means other than said conductive rims of said holes of said board is a dielectric spacer means having a plurality of conductive holes and conductor means for electrically connecting said conductive holes, wherein said conductive holes are arranged to receive said posts of said first and second contact element means.

28. An electrical connector according to claim 27, further comprising:

e) shims for coupling said spacer means and said dielectric spacer means.

29. An electrical connector for connecting a flexible printed circuit to conductive rims of holes of a circuit board, comprising:

a bent beam spring for fastening said flexible printed circuit to said circuit board, wherein said circuit board includes second holes, said bent beam spring includes at least two legs which engage said second holes of said circuit board, and said flexible printed circuit is embossed with conductive tapered contact portions for mating with said conductive rims.

* * * * *